United States Patent
Roberts et al.

(10) Patent No.: US 6,886,728 B2
(45) Date of Patent: *May 3, 2005

(54) TICKET DISPENSING MODULES AND METHOD

(75) Inventors: Brian J. Roberts, Carlsbad, CA (US); David B. Petch, La Jolla, CA (US)

(73) Assignee: GTECH Corporation, West Greenwich, RI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/570,227

(22) Filed: May 12, 2000

(65) Prior Publication Data
US 2002/0166882 A1 Nov. 14, 2002

Related U.S. Application Data

(60) Division of application No. 09/238,682, filed on Jan. 26, 1999, now Pat. No. 6,726,077, which is a continuation-in-part of application No. 09/060,423, filed on Apr. 14, 1998, now abandoned, and a continuation-in-part of application No. 08/128,406, filed on Sep. 30, 1993, now abandoned.

(51) Int. Cl.[7] .............................. B26F 3/02; B65H 35/10
(52) U.S. Cl. ....................... 225/103; 225/100; 225/105
(58) Field of Search ........................... 225/2, 4, 5, 103, 225/104, 105, 32, 100, 93, 94, 95, 96, 96.5, 97; 83/272, 303, 331, 340, 341, 342, 636, 650, 948; 463/17

(56) References Cited

U.S. PATENT DOCUMENTS

| | | | | | |
|---|---|---|---|---|---|
| 2,164,698 | A | * | 7/1939 | Buckley | 83/272 X |
| 2,836,018 | A | * | 5/1958 | Key | 83/303 X |
| 4,011,975 | A | * | 3/1977 | Brown | 226/2 |
| 4,454,973 | A | * | 6/1984 | Irvine | 225/100 |
| 4,716,799 | A | * | 1/1988 | Hartmann | 83/42 |
| 4,858,806 | A | * | 8/1989 | Schafer | 225/32 |
| 4,949,606 | A | * | 8/1990 | Pfeiffer | 83/69 |
| 4,995,507 | A | * | 2/1991 | Schafer | 225/32 X |
| 5,100,038 | A | * | 3/1992 | Schafer | 225/32 |
| 5,146,820 | A | * | 9/1992 | Nemeth et al. | 83/37 |
| 5,406,872 | A | * | 4/1995 | Conley et al. | 83/636 X |
| 5,492,398 | A | * | 2/1996 | Schafer | 312/34.7 |
| 5,673,837 | A | * | 10/1997 | Meschi | 225/100 |
| 5,803,308 | A | * | 9/1998 | Rong | 221/7 |
| 5,853,117 | A | * | 12/1998 | Traise | 225/4 |
| 6,726,077 | B2 | * | 4/2004 | Roberts et al. | 225/103 |

* cited by examiner

Primary Examiner—Clark F. Dexter
(74) Attorney, Agent, or Firm—Kenyon & Kenyon

(57) ABSTRACT

The dispenser dispenses tickets such as instant-winner lottery tickets from a strip in which the individual tickets are delineated by perforation lines. The dispenser includes a separator to tear the tickets apart before issuing them from the machine. The mechanism is simplified by using a separator member and transport drive structures which span a plurality of different channels or bins of a multi-channel dispenser. This provides a very compact, simple, secure and low-cost mechanism which is used both in stand-alone ticket vending machines, and in counter-top attended dispensers.

9 Claims, 13 Drawing Sheets

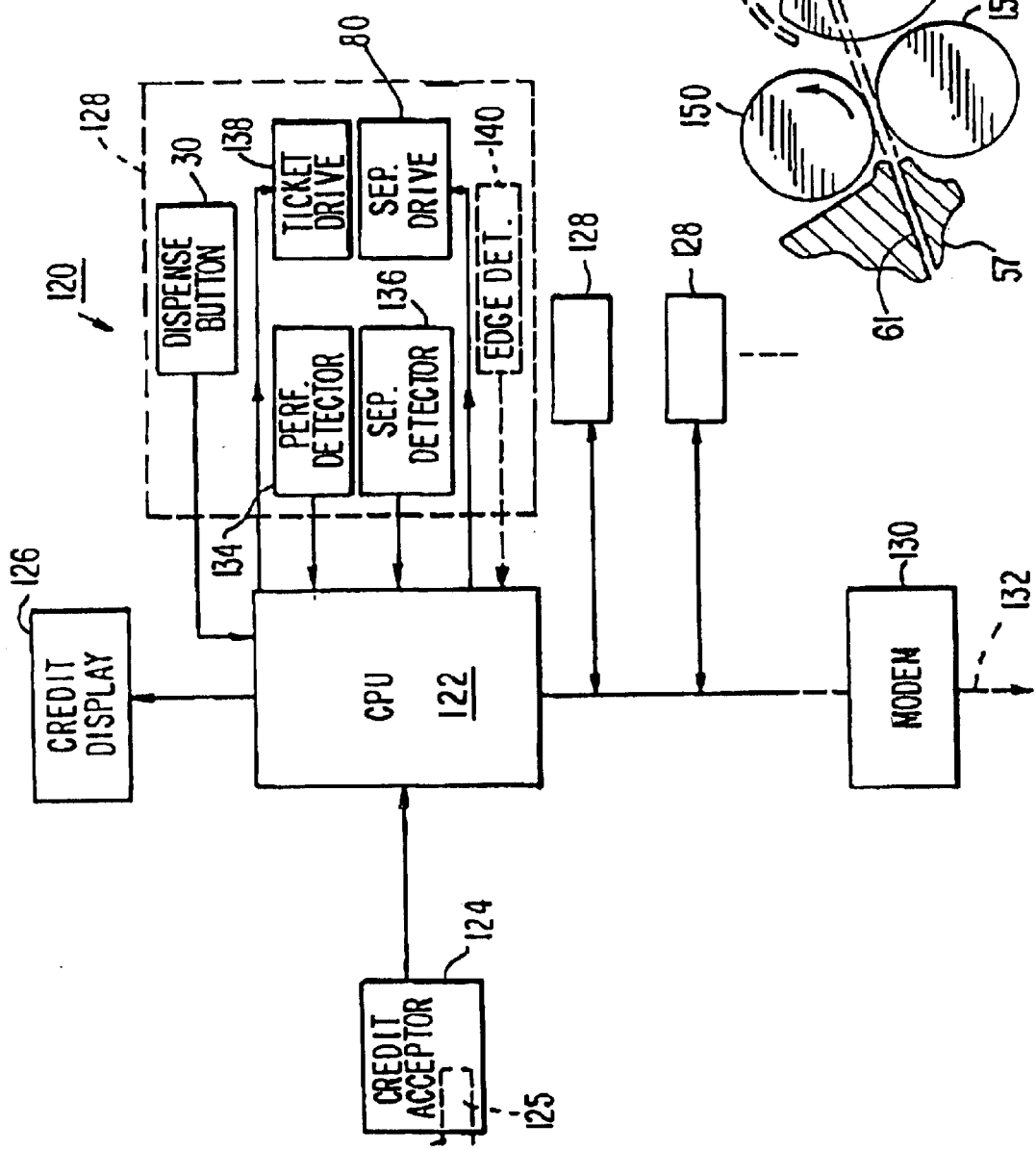

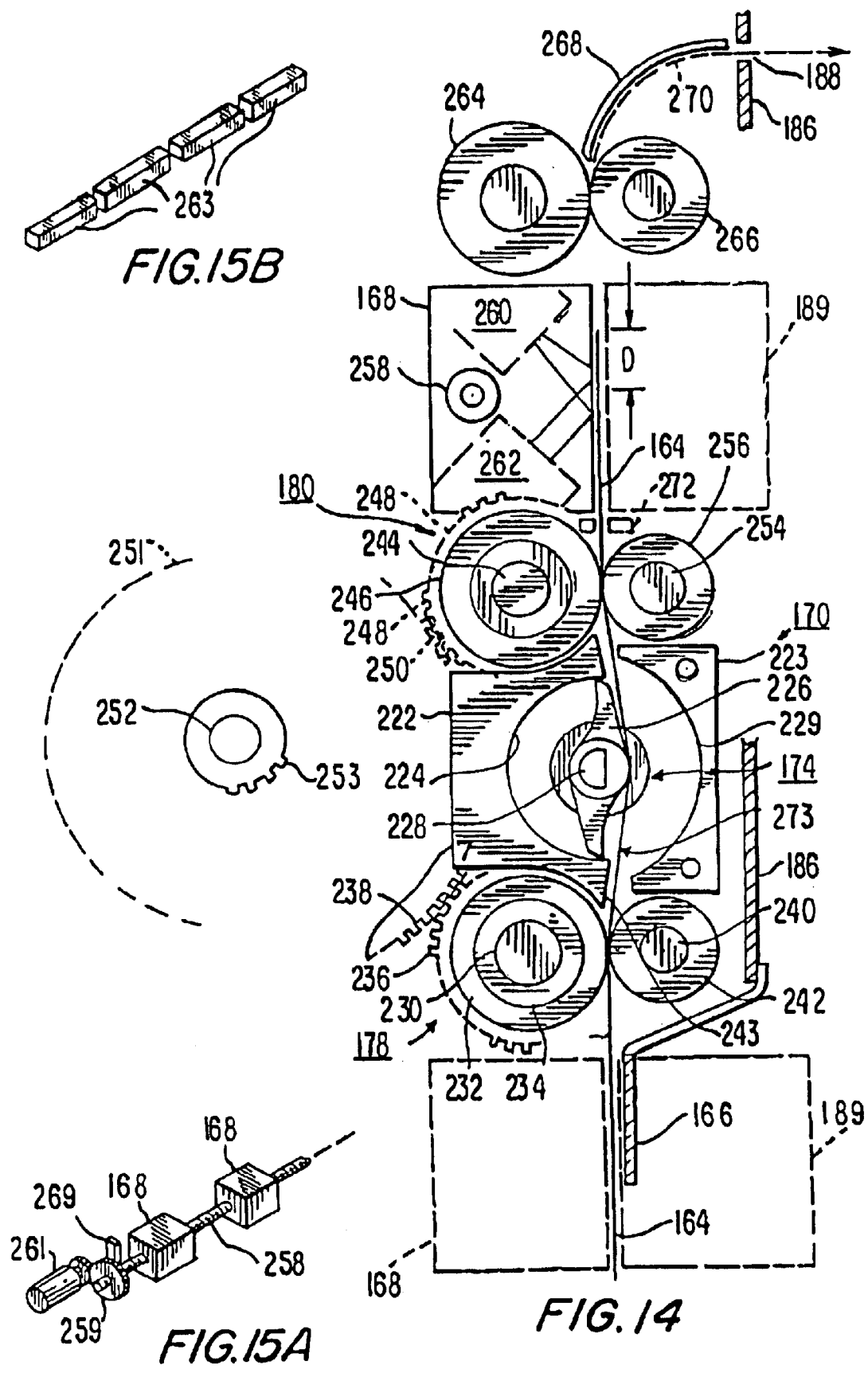

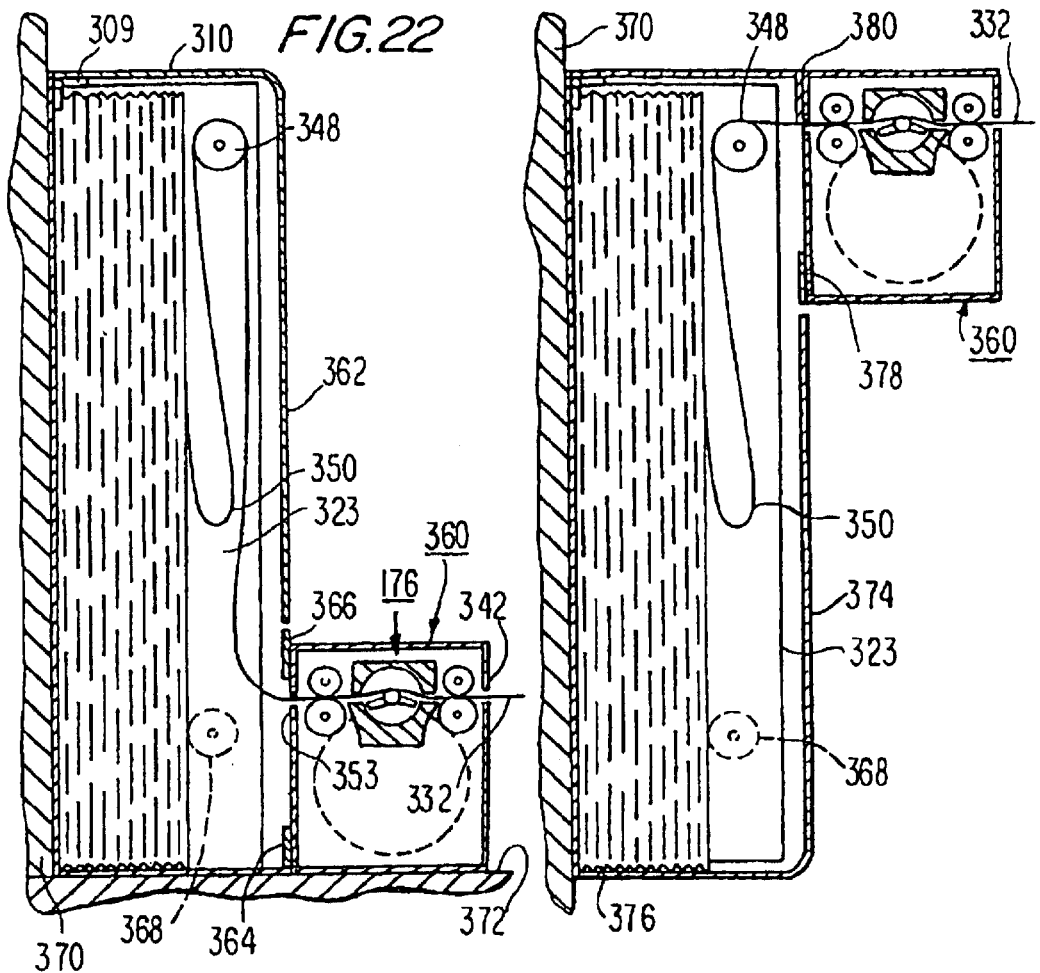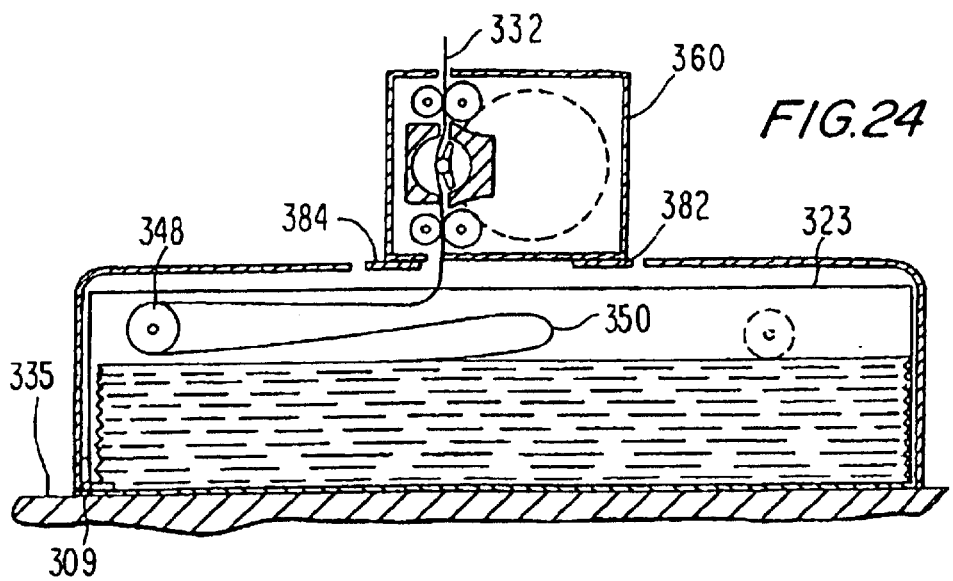

TICKET DISPENSING MODULES AND METHOD

This application is a division of U.S. patent application Ser. No. 09/238,682, filed Jan. 26, 1999, now U.S. Pat. No. 6,726,077, which is a continuation-in-part of U.S. patent application Ser. No. 09/060,423, filed Apr. 14, 1998, now abandoned, and of U.S. patent application Ser. No. 08/128,406, filed Sep. 30, 1998, now abandoned.

This invention relates to dispensers, vending machines and methods, and particularly to dispensers, vending machines and methods for dispensing tickets from strips in which the tickets are delineated from one another by lines of weakness, such as perforation lines. Preferably, the dispensers are used to dispense "scratch-off" or "instant-winner" lottery tickets.

Various types of machines have been provided for dispensing and vending "instant-winner" or "scratch-off" type lottery tickets. Such tickets are characterized by being printed in long strips in which each ticket is delineated from the others by perforation lines.

The tickets often are stored in fan-fold form in a vending machine, and are issued in response to the insertion of money by the customer. The tickets are characterized by being printed on relatively heavy stock which is relatively stiff, but still flexible.

In some of the vending machines, the customer tears the tickets off of the strip by pulling on the ticket as it extends from the machine. In other such machines, the machine bursts each ticket apart from the rest and dispenses it separately.

In the type of dispenser in which tickets are burst free from the strip, there are several significant problems.

One of the main problems is that the separating mechanism currently used is relatively large, complex, and expensive to build and maintain.

Another problem with such prior dispensers is that the most common of such dispensers burst each and every ticket free from the strip. This tends to thwart the desires of some customers who would prefer to receive a string of connected tickets.

A further problem is with the loading of tickets into a multi-bin lottery ticket dispensing machine. The service representative usually is required to read certain information off of the tickets in a batch to be loaded into one bin, and load the information into the microprocessor controller of the vending machine by use of a keypad or the like. This is time-consuming, laborious, and error-prone.

Another problem with such systems is that winning tickets usually require verification. Ticket verification usually is performed when the customer carries a winning ticket to a clerk in a store, who then inserts it into a machine which reads the code on the back of the ticket and checks with a central computer to ascertain that the ticket so identified is, indeed, a winner, and to verify the winning amount. When this verification is complete, the holder can be paid the winnings.

Although this procedure minimizes certain kinds of errors and fraud, it does not detect a ticket which has come into the possession of the holder by means other than its actual dispensation from a vending machine.

Another problem with instant-winner gaming tickets is that a relatively large variety of different games are developed in order to keep the ticket buyers' interest. This creates additional costs for the lottery ticket issuing organization, requires more dispensing bins per vending machine, and/or more vending machines to dispense the multitude of games.

It is another problem with ticket vending systems that they do not provide accounting for all of the tickets dispensed by the vending machines in the system.

Accordingly, it is an object of the present invention to provide a ticket dispenser and vending machine which separates tickets from one another, and yet has a separator mechanism which is relatively simple in construction and operation, and is relatively compact and inexpensive to manufacture and maintain.

In addition, it is an object of the invention to provide such a dispenser and vending machine in which tickets can be issued either singly or in strips of several tickets fastened together, as desired by the customer.

An additional object of the invention is to provide such a separator mechanism which requires relatively low levels of force to be applied to create the separating action.

A further object of the invention is to provide a vending machine and method in which initializing each machine and loading it with tickets requires less time and labor, and is less subject to error.

It also is an object of the invention to provide a lottery ticket dispensing system and method which is less likely to suffer from fraud.

It is another object of the invention to provide a gaming method and apparatus in which a super prize is offered which greatly heightens interest in the games without excessively increasing the cost to the operator.

It is a further object of the invention to provide a lottery ticket vending machine system and method in which every ticket which is sold can be accounted for without undue cost.

In accordance with the present invention, the foregoing objectives are satisfied by the provision of a vending machine with means for issuing a number of tickets corresponding to the amount of monetary exchange provided to the machine by the customer, and in which there is a separator for separating tickets from a ticket strip by bringing a skewed separator member into engagement with the ticket strip adjacent a selected line of weakness. The skewing is such that motion of the strip and the separator member relative to one another tears adjacent tickets apart along the line of weakness at a location which progresses along the line of weakness.

Further, in accordance with the invention, the separating apparatus requires a relatively low level of separating force to be applied to accomplish the separating action. This reduces the wear on the machine components, reduces the energy required for the separating operation, and reduces the cost of the components.

Preferably, the separator member is rotatably mounted on an axis transverse to the direction of motion of the ticket strip, and the most preferable form of the separator member is a dull blade which describes a helix. As the blade is rotated into contact with the strip, first one portion and then laterally-spaced portions of the blade contact the strip, pressing firmly on it and tearing the strip apart along the selected line of weakness.

It also is preferred that a guide be provided to urge the ticket strip into contact with and bend it around the rotary separator so as to stiffen the ticket strip and otherwise facilitate the separation process.

The ticket strip upstream from the separating location is held against movement under pressure from the separator by the ticket guide structure. In addition, a conveyor system is provided to guide the output ticket against the separator and out of the ticket outlet.

In one embodiment, a line-of-weakness or perforation detector is provided to detect each line of weakness (perforation) and use the perforation detections to control the movement of the strip. In particular, movement is controlled so that a selected line of weakness is guided to a separating location, at which position the strip stops, if a separating operation is to be performed.

Preferably, the line of weakness detector bends the ticket strip through a substantial angle and detects the lateral deflection of the strip which occurs when a perforation reaches the point at which the bend is created. This is used to create an electrical signal which then is used to control the drive system and separating mechanism.

The use of a perforation detector makes it possible to accurately and reliably detect the position of the ticket strip without tearing off every ticket from the strip. This makes it possible to issue the tickets in strings as long as the customer pays for them.

Alternatively, a leading edge detector can be used to detect the position of the strip, and the position of the next line of weakness for separation can be calculated. Thus, the tickets can be issued either singly or in strings containing multiple tickets.

The vending machine preferably accepts cash or credit cards in payment, or can accept vouchers with bar-coded information which is read by a bar-code reader to cause the machine to issue the proper number and type of tickets.

The foregoing objects also are met by the provision of a dispensing or vending machine and method in which a code reader is provided for every channel or bin of the dispensing machine to read a machine-readable code on each ticket when it is dispensed. The coded information includes a unique identification code which is printed on each ticket to uniquely identify it. The coded information is converted into electrical signals which are stored in the memory of the electrical system of the dispenser, and/or in a central computer to which vending information is transmitted.

Alternatively, each channel of the dispensing or vending machine is identified by a bar code. When loading a new supply of tickets in the channel, a hand-held bar code reader is used to read the bar code for the channel, and the bar codes for both the first and last tickets in the supply loaded into that channel. In this way, the computer receives the information necessary to initialize the dispenser without the need for anyone to key the information in.

When the ticket is presented for payment, the information read from it is compared with that stored in the local and/or central computer. Not only is the identification of the ticket read, together with the information as to whether it is a winner and how much it is entitled to in winnings, but it also is determined whether the ticket has been dispensed by one of the dispensers in the system. If not, then the ticket is not validated for payment.

The code readers also are used in a system and method to easily initialize the operation of each vending machine. When a strip of tickets first is inserted into the machine, it is passed through the code reader, which reads all of the information from the first ticket in the strip necessary to initialize the control system of the machine. This information includes the ticket length, the number of tickets in the batch, the identification numbers of the tickets, the type of game and cost of each ticket, the same information as read in by means of the hand-held wand in the method described above. Since this information need not be read by the service representative and entered on a keypad, less time is required to load the machine, and fewer errors will be made in the loading process.

The objects of the invention also are satisfied by the provision of a gaming method and system in which one or a very limited number of jackpot prizes is provided by the operator of an entire lottery system having many different instant-winner ticket games. A small number, such as one to three tickets, are distributed in various games as jackpot winners.

The jackpot can be a pre-determined amount, or, preferably, it can increase with the sale of each ticket in the system. The code readers are used to detect the sale of each ticket, and the central computer in the ticket system adds a small increment of money to the jackpot every time a ticket is sold until there is a winner. When the code number of a jackpot winner is detected by one of the code readers, this is made known immediately to the winner who bought the ticket, and a signal is sent to stop the further accumulation of money in the jackpot. The jackpot then is started again with a smaller amount.

The smaller amount can be a fixed sum, or it can be determined by accumulating a "shadow" jackpot of a smaller sum per ticket sold simultaneously with the accumulation of the main jackpot, and then substituting the "shadow" jackpot for the main jackpot when a winner has been detected so as to start the new main jackpot with the total in the "shadow" jackpot.

This gaming system and method greatly increases the interest in the game, without adding any new individual games, and without having to add a large prize for each of a large number of games.

Also in accordance with the present invention, the detection of the dispensing of every ticket by use of the code readers makes it possible to improve the accounting of the system by accounting for the sale of each and every ticket. This provides a cross-check to detect theft and fraud, and reduces errors.

The object of making the dispensing mechanism more compact, simpler and less expensive to manufacture is met, in accordance with one aspect of the invention, by using a single separator mechanism for a plurality of side-by-side ticket dispensing channels. For example, by use of this aspect of the invention, instead of four separator motors, only one separator motor is required. It drives a single separator member which spans all of the channels.

The number of drive motors for moving the ticket strips in the side-by-side channels also is reduced to one. The single ticket drive motor operates a single drive shaft with one clutch for each ticket channel to selectively move the ticket strip in a selected channel upon demand.

The single separator member preferably has a helical portion in each channel. The separator is rotated once in order to separate any ticket in position to be separated in any of the four channels.

This mechanism is so much lighter in weight, less complex and more compact than other comparable mechanisms that it can be used advantageously to dispense and separate tickets from counter-top dispensers which normally are operated manually by clerks in stores.

Preferably, each counter-top dispenser has a drive and separator module which is attached to a housing for storing multiple batches of tickets in multiple channels. The drive and separator unit can be attached at either end of the housing, or in the middle of the housing, and can issue tickets in a direction either parallel to the long dimension of the unit, or perpendicular thereto.

Separate dispensing modules can be stacked atop one another on a counter-top to give a larger selection of games to the customer. Alternatively, the modules can be hung from a wall in groups, or they can be stored under a transparent top of a counter in a store, or they can stand upright on one end on the store counter-top, or hung from a rack near the counter, or in other convenient arrangements.

The order to dispense tickets is given to the dispenser by the clerk at a computer terminal, such as one presently used for selling Lotto type tickets, so that the clerk exclusively controls the dispensing of the tickets.

Alternatively, a separate small dispensing control terminal can be provided near each cash register in the store to dispense tickets under the control of the clerk.

As another alternative, separate control module can be supplied together with a group of dispensers attached to a support surface such as a wall to provide for the selection and dispensing of tickets from the dispensers, and the acceptance of payment so as to create a vending machine operated by the customer.

The foregoing and other objects and advantages of the invention are set forth in or will be apparent from the following descriptions and drawings.

IN THE DRAWINGS

FIG. 7 is a schematic block diagram of an electrical control circuit for the machine of FIG. 1;

FIG. 8 is a partially schematic side elevation view of another embodiment of the invention;

FIG. 14 is a front elevation, partially cross-sectional and partially schematic view of a gaming ticket transport and separator mechanism constructed in accordance with the present invention;

FIG. 15A is a perspective schematic view of the code-READER of the device shown in FIG. 14;

FIG. 15B is a perspective schematic view of an alternative code-reader for use in the device shown in FIG. 14;

FIGS. 22, 23 and 24 are cross-sectional views like that of FIG. 20, each showing a separate alternative embodiment of the unit shown in FIGS. 19 and 20;

GENERAL DESCRIPTION

Figure 1:
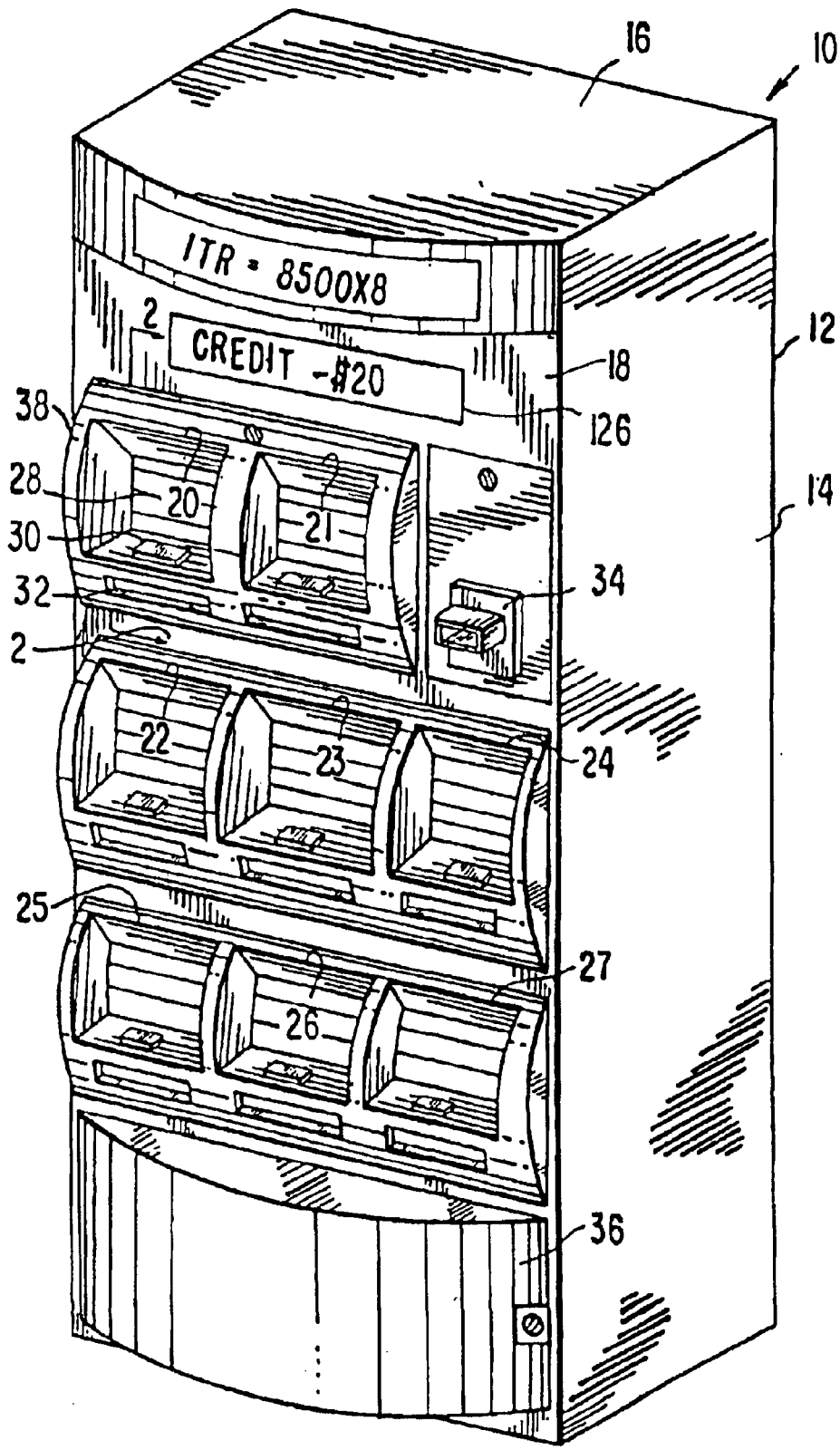
FIG. 1 is a perspective view of a ticket dispensing and vending machine constructed in accordance with the present invention.

FIG. 1 is a perspective view of a vending machine 10 constructed in accordance with the present invention. The vending machine is specifically designed to sell instant-winner or "scratch-off" type lottery tickets.

The machine 10 includes a housing 12 having side walls 14, a top wall 16, front wall 18 and a bottom wall and a rear wall (not shown).

Extending from the front wall 18 are a plurality of window frame structures forming eight separate dispensing units 20 through 27, each having its own dispensing mechanism 29 and being adapted to dispense lottery tickets which are displayed in a window 28 of each unit.

The lottery tickets are ordered by the customer first inserting cash or other means of monetary exchange into a receptor device 34. The device 34 preferably receives paper currency. Alternatively, it will accept coins, credit cards, or a printed voucher slip bearing bar-coded information regarding the identity and the number of tickets ordered and paid for at another location.

The credit corresponding to the amount of money or credit deposited appears on a display 126.

The customer then depresses a selector button 30 in one of the eight dispensers and a corresponding ticket is dispensed through an outlet dispensing slot 32.

The customer can dispense as many tickets as he or she wishes in a string of tickets. Alternatively, the customer can direct that each ticket be separated from the string of tickets and dispensed separately through the outlet opening 32.

Each of the separate dispensing units 21–27 has a dispensing mechanism 29 like that of the unit 20, and operates in the same manner. Therefore, a description of only one of the dispensers, the one for unit 20, will be given below.

Dispenser Mechanism

Figure 2:
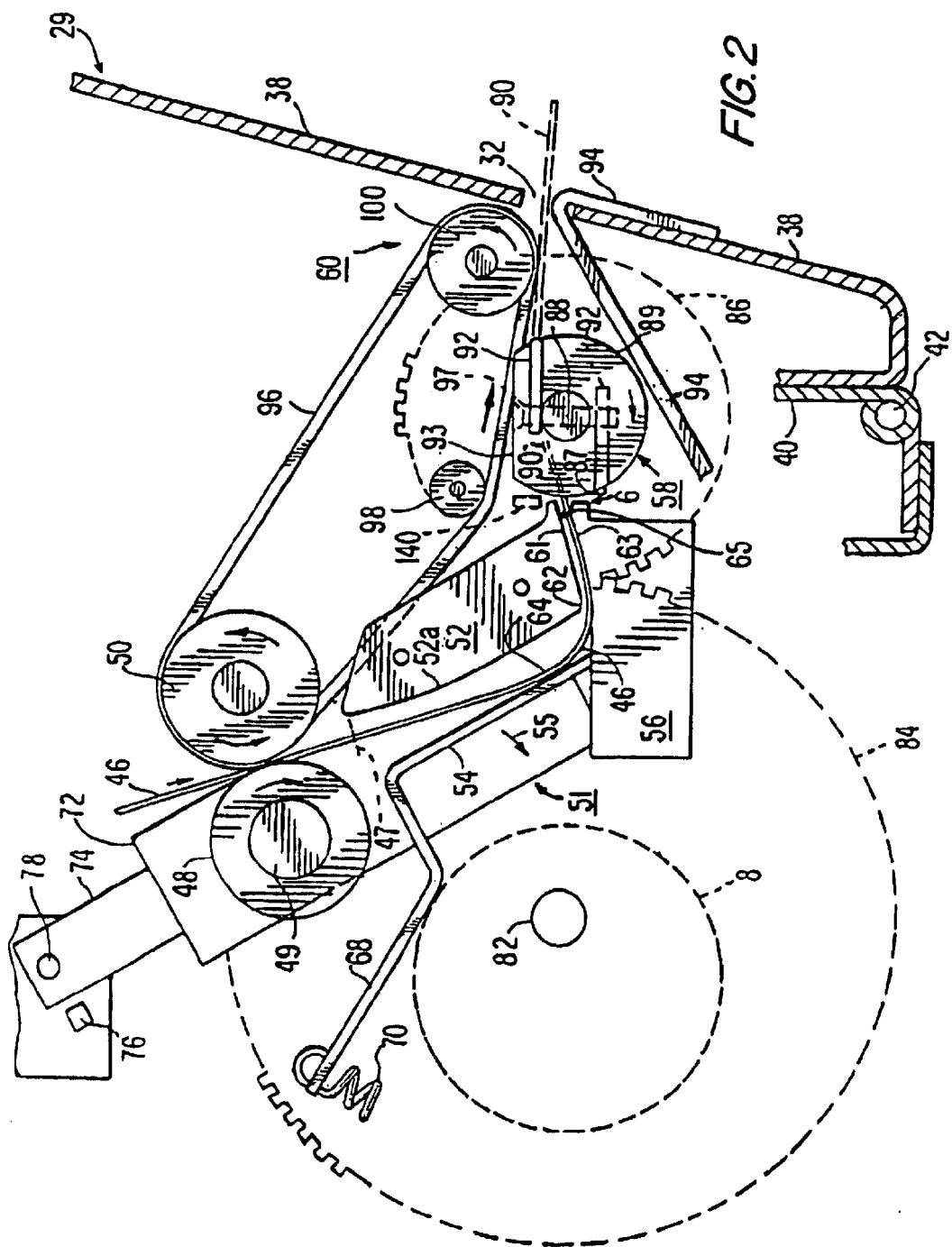
FIG. 2 is a left side-elevation, partially cross-sectional view, taken along line 2—2 of FIG. 1, of one of several ticket-dispensing mechanisms in the machine of FIG. 1.

The preferred dispenser mechanism 29 used in the present invention is shown in FIG. 2. FIG. 2 is a left side elevation view of the mechanism 29. Only a portion of the mechanism sufficient to show its operating principles is shown.

The mechanism is mounted behind a front panel 38. The front panel 38 is hinged at 42 to the metal wall structure 40 of the housing 12 of the vending machine 10. This allows easy access to the dispensing mechanisms for reloading tickets, and for servicing.

The mechanism 29 includes a ticket drive roller 48 driven by a drive motor (not shown) and a mating idler roller 50 for moving an elongated strip 46 of tickets 90 through the dispensing mechanism. In the ticket strip 46, the lottery tickets 90 are separated from one another by means of perforation lines, such as the line 47 shown in FIGS. 2 and 3.

Preferably, the tickets are stored in fan-fold stacks in the housing 12. As it is shown, in FIG. 1, the ticket strip 46 moves downwardly past the window 28 so that, as the tickets are being dispensed, the moving ticket strip is visible to the customer. The ticket stacks and the mechanism for delivering the ticket strip to the rollers 48 and 50 are not shown, for the sake of efficiency in the drawings and because these aspects of the vending machine 10 are well known.

The ticket strip 46 moves downwardly through a perforation detector indicated generally at 51. The perforation detector, which also is well known, consists of an angular guide member 52 and a gate member 54 which is attached to a pair of end members 72 which are pivotably mounted on the shaft 49 on which the drive roller 48 rotates. Only one of the end members 72 is shown in FIG. 2.

The perforation detector also includes a deflector block 56. The guide member 52 has a sharp edge at 62 and has a transverse edge 61 which is parallel to and closely spaced from an upwardly-sloping portion 57 of the deflector block 56 to form a slender, upwardly-directed outlet passageway for passage of the ticket strip 46.

Figure 3:
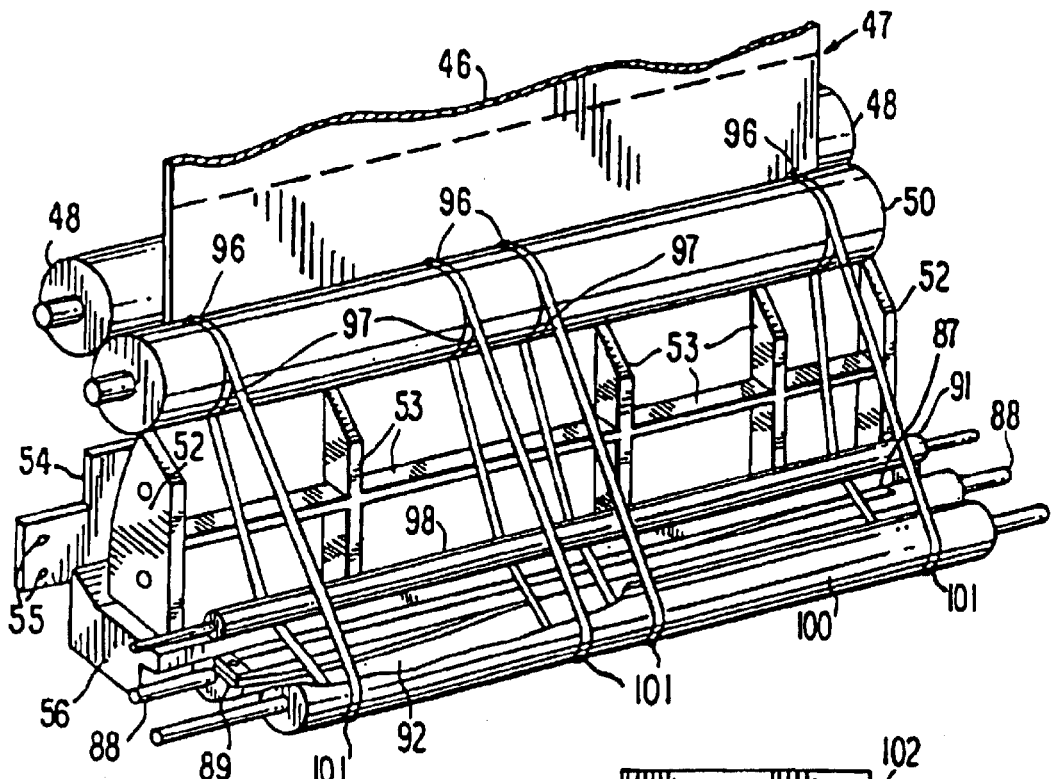
FIG. 3 is a perspective, partially schematic view of the mechanism of FIG. 2.

The walls 53 shown in FIG. 3 as part of the guide structure 52 are reinforcing walls. The members 52 and 56 preferably are molded out of a sturdy plastic material such as ABS, or can be made of steel should a more secure structure be required.

The ticket strip 46 passes through a separator mechanism indicated generally at 58.

Also provided is a conveyor system indicated generally at 60 which helps guide the ticket to be dispensed over the separator mechanism, and under the forward roller 100 to guide the ticket 90 to be dispensed toward the outlet opening 32.

Perforation Detector

Referring again to FIG. 2, as the leading edge of a ticket strip enters between the drive rolls 48 and 50 and moves downwardly, its edge strikes the deflector block 56 at an angle which impedes the forward progress of the ticket and bows it outwardly against the gate 54 as indicated at 64. As the bowing increases, the angle between the leading edge of the ticket strip 46 and the deflector block 56 decreases, which allows the leading edge to slip past the sharp edge 62 and into the narrow outlet passageway of the perforation detector. This causes the gate 54 to swing about its pivot point in a clockwise direction, as indicated by the arrow 55.

An arm piece 74 extends outwardly from the gate pivot axis defined by the shaft 49 as the gate 54 rotates. This motion moves a magnet 78 mounted on the arm 74 away from a Hall-effect detector 76 mounted on a stationary support in the dispenser mechanism. This motion causes a signal to be developed which indicates to the control circuitry of the machine that a ticket is being transported through the dispenser and that the perforation has not yet reached the corner 62.

The gate 54 is urged towards the surface 52a of block 52 by the light pull of a coil return spring 70 attached to the outer end of an arm 68 extending from the gate. The spring 70 forces rotation of the gate in a counterclockwise direction and closes the gate when the ticket strip is not bowed.

In a bowed condition, the strop 46 progresses downwardly until the perforation 47 travels past the gate 54 and reaches the sharp corner 62 where it bends along the perforation line. Because the strip bends very easily along the perforation line, the bow 64 disappears, and the gate rotates counterclockwise and closes, thrusting the ticket strip against the left vertical surface 52a of the member 52. The arm 74 and the magnet 78 rotate counterclockwise, under the force of the spring 70, until the magnet 78 overlies the Hall-effect detector 76. This creates a signal indicating that a perforation has been detected.

The control circuitry microprocessor 122 (FIG. 7) is programmed to then move the ticket strip a fixed further distance equal to the distance between the corner 62 and the outlet opening 66 from the outlet passageway. Then, the drive mechanism stops with the perforation line 47 located at the point 66. The point 66 will be called the "separating location."

Thus, the perforation detector 51 detects each perforation and uses that detection to correctly position the perforation at the separating location 66.

The drive roller 48 is driven through a known anti-reversing mechanism (not shown) to prevent tickets from being pulled from the machine by a customer pulling on the strip 46. The seating of the corner 62 in the bend at a perforation line also tends to prevent such fraud.

Separating Mechanism

Figure 5:
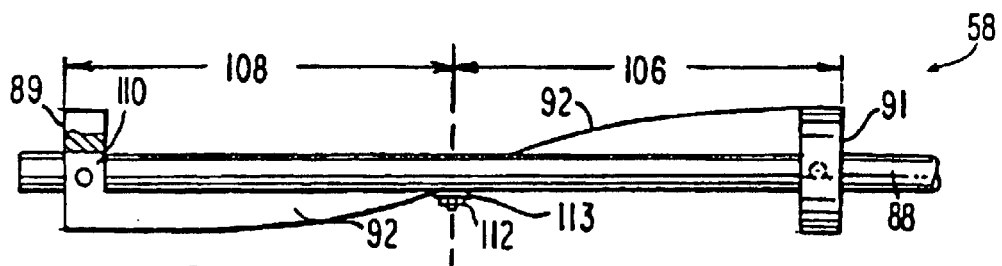
FIG. 5 is a top plan view of the separator member of the mechanism of FIGS. 2–4.

Referring now to FIGS. 2–5, and particularly to FIG. 5, the separating mechanism 58 includes a shaft 88 with two hubs 89 and 91 at opposite ends and a dull-edged helical blade 92 secured at each end to one of the hubs 89 and 91. The blade extends around the shaft 88 through an angle of approximately 180°.

Referring now to FIG. 2, the shaft 88 is rotated by means of a drive motor 80 whose output drive shaft is shown at 82. A large spur gear 84 is mounted on the shaft 82 and drives a smaller spur gear 86 attached to the shaft 88. The gears 84 and 86 are in the foreground of the structure shown in FIG. 2, and are shown mostly in dashed outline in order not to obscure the parts behind them.

As it is shown in FIG. 5, each end of the blade 92 has a projection 110 with a hole in it (only one end is broken away to show the projection). As it is shown in FIGS. 2 and 4, each of the hubs 89 and 91 has a flatted section 93 or 95, respectively.

Figure 4:
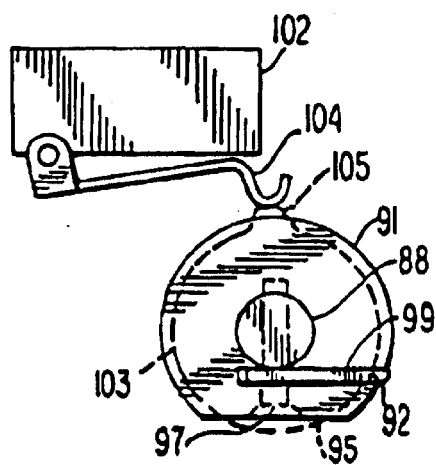
FIG. 4 is a right-side elevation view of a portion of the mechanism of FIGS. 2 and 3.

As it is shown in FIGS. 2 and 4, the ends of the helical blade 92 are fitted into slots cut in each hub parallel to the flat 93 or 95 so that the end of the blade is roughly tangent to the shaft 88 at each end of the structure. A screw 97 passes through the hub, the projection 110 (FIG. 5), the shaft 88, and into a threaded hole in the hub on the opposite side of shaft 88 to hold the end of the blade 92 securely in the hub. As it is shown in FIG. 5, a screw 112 passes through a tab 113 on the blade 92 to hold the center of the blade onto the shaft 88.

The conveyor system 60 is used to assist in the separating process. An idler roller 100 is positioned downstream from the separator mechanism and just adjacent to the ticket dispensing outlet opening 32. Another idler roller 98 is located to the left of the roller 100 and slightly above it. Roller 98 is smaller in diameter than the roller 100.

As it can be seen in FIG. 3 of the drawings, the conveyor mechanism includes four conveyor bands 96, which preferably are rubber O-rings which ride in circumferential grooves 50a and 100a in the rollers 50 and 100, respectively.

When the ticket exits the narrow outlet passage, the leading edge is directed tangentially towards the top of the shaft 88, and into O-rings 96 which divert the ticket downwardly and under roller 100, binding the ticket over the separator shaft to form an arc. This stiffens the ticket and assists in the separating process.

An angular metal guide plate 94 assures that the ticket 90 is guided towards the exit opening 32. The roller 100 also serves to guide the ticket 90 through the exit opening 32.

Separator Blade Operation

The manner in which the separator blade 92 separates the leading ticket 90 from the ticket string now will be described.

When a separating signal is received from the control CPU 122 (see FIG. 7), the motor 80 starts rotating the shaft 88 in a clockwise direction, as shown in FIG. 2. The leading edge of the blade is shown at 87. It is at the right-hand end of the blade structure (see FIG. 3).

With the blade 92 in the position shown in FIG. 2, prior to separation, the lead ticket 90 slides upwardly and over the shaft 88 in a portion where the blade 92 does not block the passage of the ticket 90, and the leading edge of the ticket is moved through the dispensing outlet 32 until the perforation at the junction between the lead ticket 90 and the following ticket reaches and stops at the separation location 66.

A separation signal is created at this point, and this starts the motor 80.

As the shaft 88 starts rotating clockwise during a separating movement, the leading edge 87 of the blade first contracts the portion of the ticket closest to the right-hand hub 91. This pushes upwardly against the ticket stock while the up-stream portion of the ticket strip is being held in the outlet slot formed in part by edge 61. Thus, the blunt edge of the blade moves upwardly and starts tearing the ticket at the right hand edge of the ticket strip (as shown in FIG. 3).

As the shaft 88 rotates further, the helical blade 92 makes contact with the ticket stock at a point which moves successively towards the left, as shown in FIG. 3. This action continues and, as the helical blade 92 continues to rotate, it contacts the ticket stock at points which moves gradually from the right hand hub 91 to the left hand hub 89 and thus tears the ticket progressively along the perforation line 47.

When the ticket has been completely separated, the shaft 88 continues to rotate until it has rotated one complete revolution.

The rotation is detected by the arm 104 of a feeler switch 102 which rides on a cam 103 attached to the right end of the shaft 88 (see FIG. 4). When the feeler arm 104 detects the cam projection 105, this creates a signal which indicates that the shaft has reached its home position. This stops the motor 80 and the separator mechanism waits for further instructions.

The customer now can remove the ticket 90 from the machine without having to tear it off.

Although it is generally taught in the prior art that the downstream end of the ticket 90 to be dispensed should be held during the separating operation using prior separators, with the present separator this is not necessary. It is only necessary to prevent the downstream portion of the ticket 90 from flexing downwardly. This is accomplished by angular guide plate 94. Even though the blade 92 is dull, its movement upwardly past the narrow outlet slot of the perforation detector creates a shearing action which tears the tickets apart along the perforation line, without holding the ticket firmly at a downstream location.

An alternative embodiment of the invention is shown in FIG. 8. Instead of the O-ring 97, there are two pairs of drive rollers 150, 152 and 154, 156 and a curved guide 158 which bends the ticket around the shaft 88. The rollers 154, 156 drive the ticket out of the machine.

Control Circuit

FIG. 7 is a block diagram showing the control circuit 120 of the present invention used to operate the vending machine 10.

The control circuit 120 uses a microprocessor CPU 122 to control the functions of the equipment. The CPU receives input signals from the credit acceptor 124 and sends appropriate credit display signals to the display 126 (also see FIG. 1).

The electrical components of one dispensing unit 21 are shown in dashed outline at 128. The perforation detector is represented by the block 134. The separator detector, namely, the microswitch 102 and associated circuitry, is shown at 136. The ticket drive motor is shown at 138, and the separator drive motor is shown at 80. The dispense button 30 for the dispenser also is shown.

A signal developed by depressing the dispense button 30 is sent to the CPU, which then starts the ticket drive motor 138. When the perforation detector 134 detects a perforation, it sends a signal to the CPU which causes the motor 138 to move the ticket strip the further distance required to bring the perforation to the separation location 66 (see FIG. 2), and then the motor stops. Then the CPU instructs the separator drive motor 80 to start and it rotates until the separator detector detects the completion of one revolution, and then signals the CPU which causes the separator drive motor to turn off.

Additional dispensing units are connected to the same CPU as indicated by the further blocks 128. In the case of the machine shown in FIG. 1, there are a total of eight of the blocks 128.

As it is well known, from time to time, operating information is sent over a modem 130 and telephone lines 132 to a remotely located station at with the information is stored and monitored.

The issuance of individual separated tickets or a string of tickets not separated is accomplished in the following manner.

When the dispenser button 30 is pressed and released by the customer, a single ticket will be dispensed. After removal of the ticket, the dispenser and button are enabled to repeat the process.

To issue an unbroken string of tickets the customer can hold the dispense button down until the desired number of tickets are presented, or until credit is depleted. Upon release of the button, the dispenser will either stop or advance the perforation of the last ticket in the string to the separation position, where the separation will occur.

In accordance with another aspect of the present invention, if it is preferred to detect the leading edge of each ticket and to cut each ticket and not issue tickets in strings, one can use a front edge detector as shown in dashed lines at 140 in FIGS. 2 and 7. In this case, the front edge detector would replace the perforation detector 134 in FIG. 7 and the detector 140, which can be a lamp and photocell combination for example, will cause the front edge of the ticket to stop at the proper location. Then, the ticket is moved a predetermined distance to bring the next perforation to the separating location, and the separator operates.

The credit acceptor which is conventionally used in most vending machines selling lottery tickets of the scratch-off type is a bill acceptor which will accept anything from a one dollar bill to a twenty dollar bill.

In accordance with one aspect of the present invention, the credit acceptor unit 124 shown in FIG. 7 includes a conventional bar code reader 125 to read the bar code on a voucher which has been printed with a bar code to indicate the number and type of tickets to be issued. This causes signals to be stored in the CPU corresponding to the bar code information and credits to appear and causes the appropriate number and type of tickets to be issued in accordance with the bar coded information. This enables the ordering and paying for the lottery tickets at a location separate from the location of the vending machine.

Of course, other kinds of credit acceptors can be used, such as coin acceptors and credit card readers, as is well known in the art.

The blade 92 shown in FIGS. 2 through 5 is made of aluminum. However, the blade also might be molded out of a tough thermoplastic resin.

Figure 6:
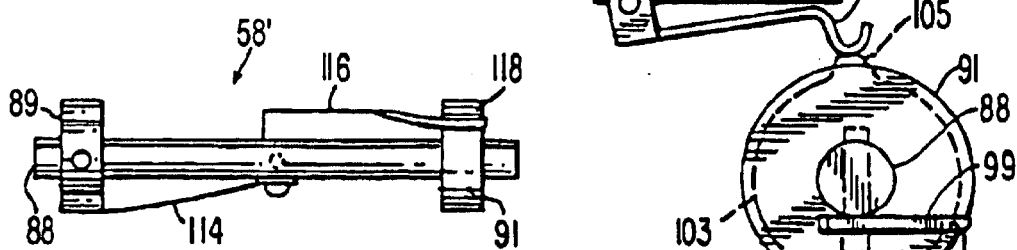
FIG. 6 is a top plan view, partially schematic, of an alternative separator member.

An alternative separator structure 58' is shown in FIG. 6. In FIG. 6, the separator blade is formed in two separate sections 114 and 116. The section 116 is rotated circumferentially with respect to the section 114 so that the separating action is performed by two separate blades spaced somewhat apart.

In general, the separator blade can be formed by a plurality of projections extending outwardly from shaft 88 so that each projection is spaced axially and circumferentially from the adjacent projection.

Code Reading

FIGS. 9, 14, 15A and 15B show different embodiments of the invention in which a code reader is provided to read the coded information from the rear surface of the ticket during the dispensing process. In addition, these Figures show new ticket transport structures which enable a substantial reduction in equipment costs and space requirements for the dispensers.

Figure 9:
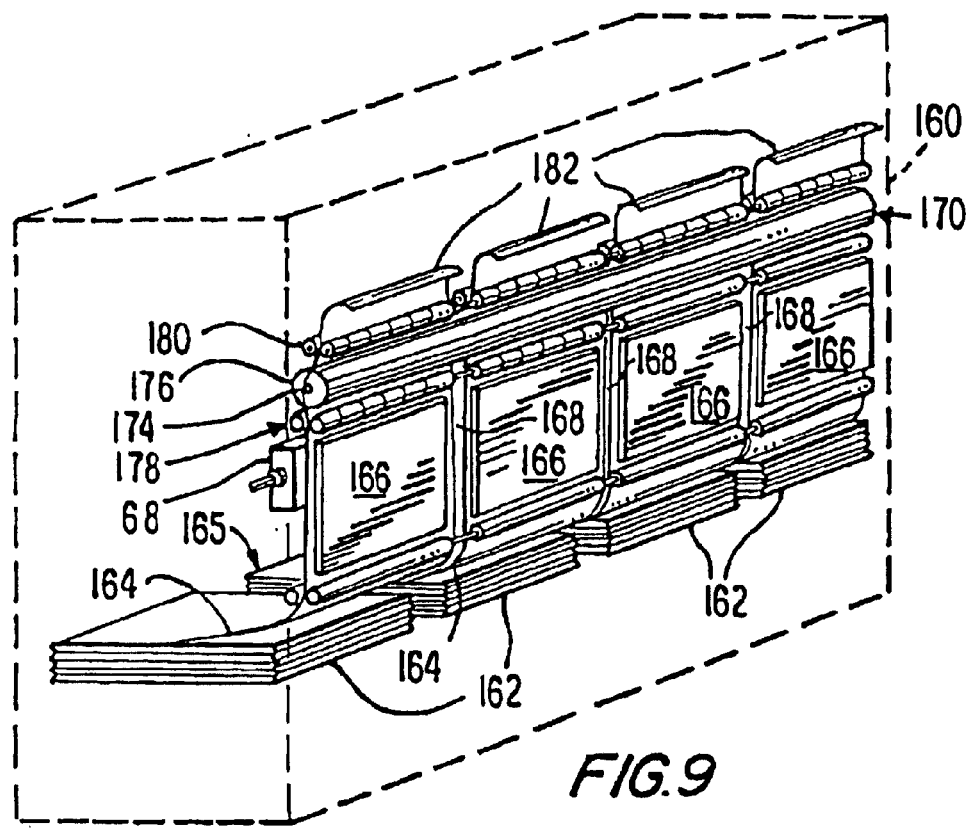
FIG. 9 is a perspective, partially schematic view of a portion of another vending or dispensing machine constructed in accordance with the present invention.

FIG. 9 is a perspective schematic view of a vending machine 160 like that shown in FIG. 1 of the drawings, except that the machine has four dispensing bins or channels in a horizontal row. The machine also has multiple rows of dispensing bins so that twelve or more dispensing bins or channels can be housed in a single vending machine roughly comparable in size to those presently featuring substantially fewer channels.

The housing 160 is shown in dashed outline to indicate the fact that it also can represent a clerk-operated dispenser which rests upon or in a store counter for use by a clerk in dispensing tickets for which he or she is paid directly.

Still referring to FIG. 9, four fan-fold stacks 162 of lottery tickets are stored in the housing 160. The housing 160 has four windows 166 like the windows shown in the machine of FIG. 1. A ticket strip 164 is pulled upwardly through a set of guide rollers 165 past each window 166 and past a bar-code scanner 168, there being one scanner for every channel. The strip is pulled upwardly by a set of drive rollers 178 into a separator mechanism 176 having a helical rotary separator element 226. Exit drive rollers 180 drive separated tickets 182 through an outlet opening in the machine housing.

Figure 10:
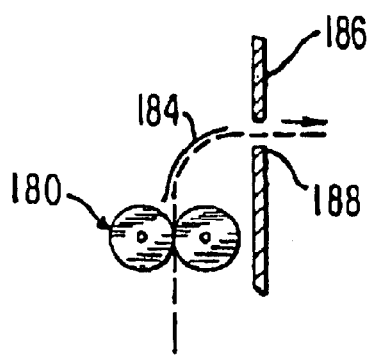
FIG. 10 is a front elevation, partially cross-sectional and schematic view of a specific feature of the device shown in FIG. 9.

FIG. 10 shows one structure for issuing the tickets through an outlet opening 188 in the housing wall 186. The rollers 180 drive the ticket against a curved guide 184 which guides it through the outlet 188 where the customer can grasp it and remove it from the machine.

Figure 11:
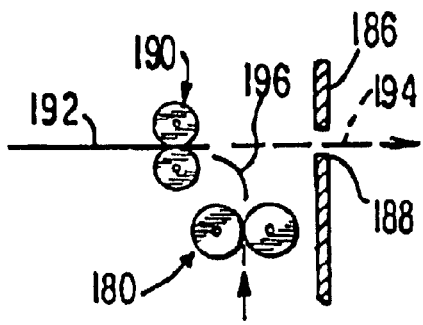
FIG. 11 is a front elevation, partially cross-sectional and schematic view of an alternative embodiment of the mechanism shown in FIG. 10.

Another arrangement for issuing the separated ticket or ticket string is shown in FIG. 11. The rollers 180 drive the separated ticket or string upwardly against a curved guide 196 which guides the ticket towards the left and into the nip of a pair of drive rollers 190. The separated ticket or string then passes through the rollers 190 until its trailing edge clears the left-most edge of the guide 196 and the ticket assumes the position shown at 192 in FIG. 11. The direction of rotation of the rollers 190 then is reversed, and the ticket or ticket string travels along the path 194 out of the machine through the outlet opening 188. This arrangement is believed to provide better security against tampering than the arrangement shown in FIG. 10.

FIG. 14 is a side-elevation, partially cross-sectional and partially broken-away side elevation view of the ticket transport mechanism in one of the channels of the machine shown in FIG. 9.

FIG. 14 shows the bar code-scanners 168 at two different alternative locations; the lower location, shown in dashed outlines, is that shown in FIG. 9. In this location, the bar code scanner scans the bar code on the rear of the ticket before it reaches the separator mechanism.

When the bar code scanner is in the uppermost position, shown in solid outlines in FIG. 14, the code is read after the ticket has been separated from the strip and is about to be issued from the machine.

The lower location shown in FIG. 14 is advantageous when the mechanism is aligned vertically as is shown in FIG. 14, in that it requires less vertical space for the mechanism than the location at the top of the mechanism.

It should be understood that the mechanism shown in FIG. 14 also can be rotated 90° to be horizontal and issue tickets from the machine in a horizontal direction.

The vertical orientation shown in FIG. 14 has the advantage that it facilitates feeding tickets from the top of the stack so that they can be dispensed with ascending serial numbers, and also can be used in existing counter-top clerk operated manual dispensers.

Multi-Channel Spanning

Advantageously, the number of parts and the size of the transport and separator mechanism are minimized by using a structure in which the drive and separator elements span a plurality of channels or bins.

Figure 16:
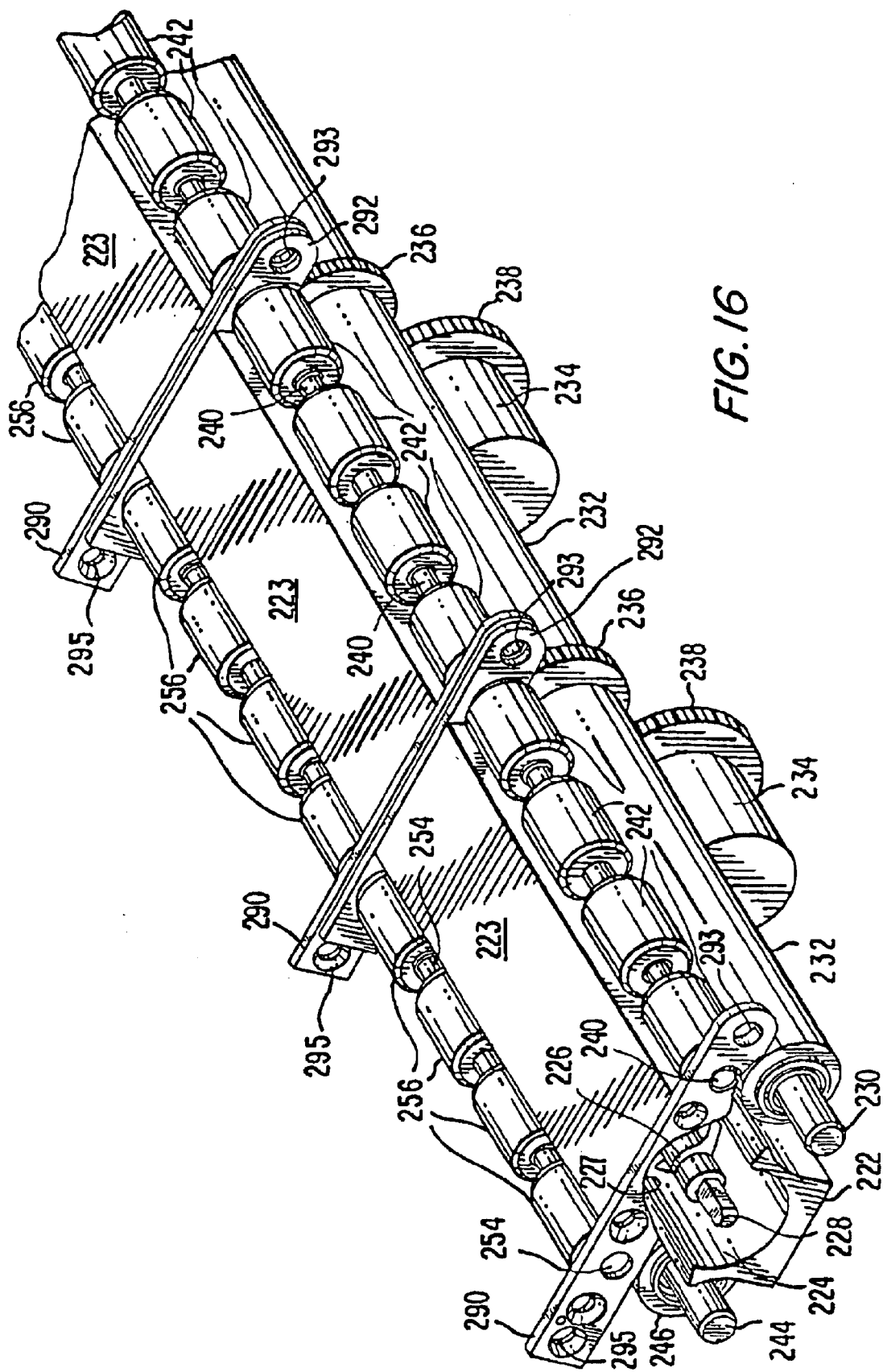
FIG. 16 is a top perspective view of a portion of the mechanism shown in FIG. 14.
Figure 17:
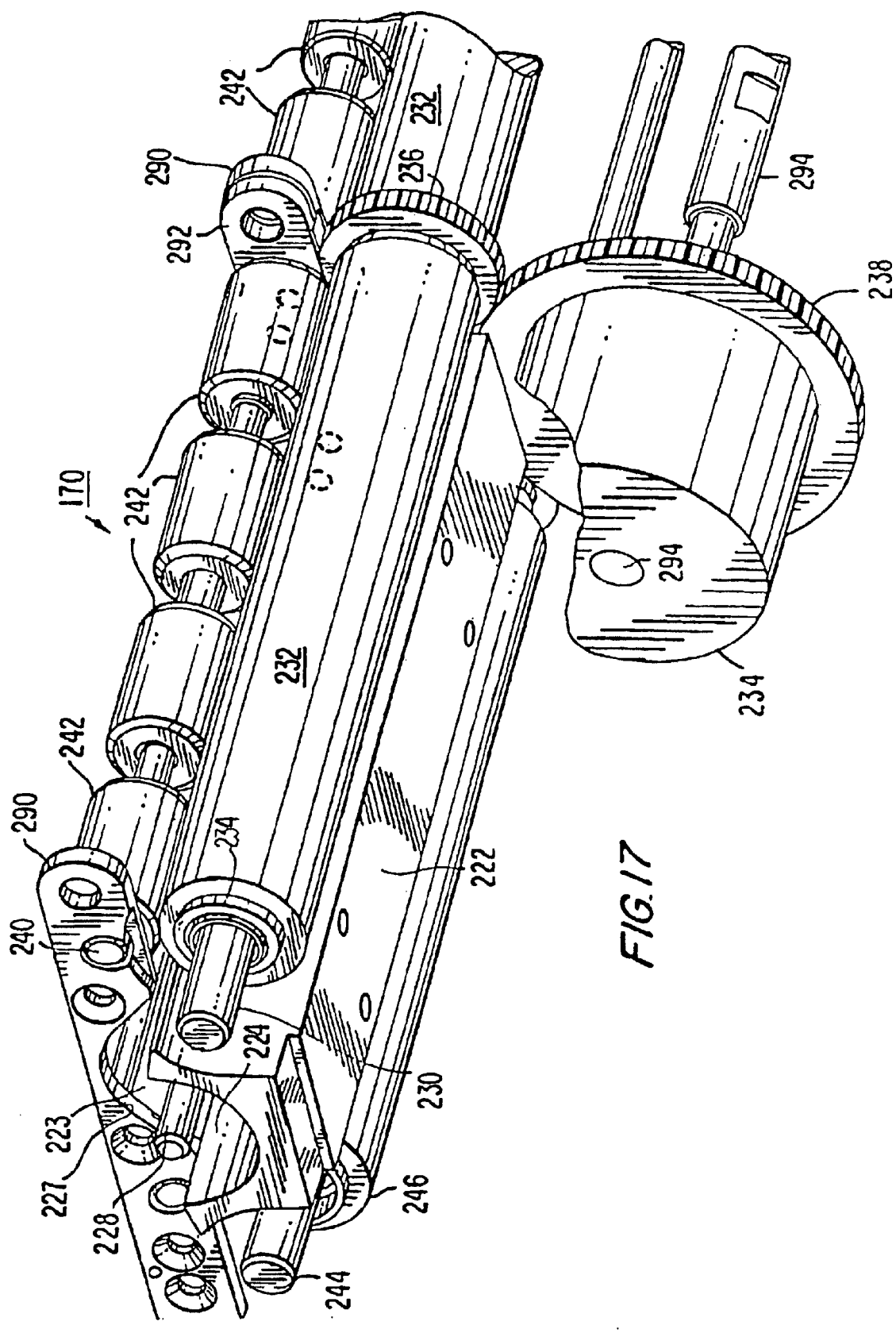
FIG. 17 is a bottom perspective view of some of the mechanism shown in FIG. 16.

As shown in FIGS. 14, 16 and 17, a single elongated body member 222 is provided to span the four bins. Preferably, member 222 is an aluminum extrusion having a semi-circular channel 224 in which the separator member 226 is mounted to rotate.

As it is shown in FIG. 16, four upper body members 223 are provided. Four idler roller assemblies are provided, each consisting of a pair of end brackets 290 and 292 (see FIGS. 16 and 17) which have a curved cut-out area 227 to accommodate the rotary separator member, and eight idler rollers 242 and 246 mounted to rotate on axles 240 and 254, respectively. The brackets 290, 292 are fastened to opposite ends of each upper body member 223. Two end plates (not shown) are attached at opposite ends of the extrusion and a rod (not shown) passes through holes 293 in the brackets to serve as a hinge or pivot for lifting each assembly to relieve ticket jams in the unit. Latch means (not shown) is provided using the holes 295 in the brackets to urge the pinch rollers in to firm contact with the drive rollers. One or more springs (not shown) assists in biasing the idlers in this manner.

Referring still to FIGS. 14, 16 and 17, each of the four channels of the dispenser is spanned by two shafts 230 and 244. The input drive roller unit 178 includes four drive rollers 232, one for each of the four channels, which are rotatably mounted on the stationary shaft 230.

A single drive shaft 294 (see FIG. 17) is driven by a stepping motor 251 with an output drive shaft 252 which rotates four spur gears, each of which can drive spur gear 238 which meshes with spur gear 236 secured to one of the rollers 232. When engaged, an electrically operated clutch 234 couples gear 238 to the drive shaft 294. Thus, by selective operation of the electric clutches, rotation of the drive shaft 294 causes only a selected one of the rollers 232 to be driven to drive the ticket strip in the selected channel.

The rollers 246 are driven by the stepper motor 251 to move separated tickets out of the separator mechanism and, in some instances, out of the vending machine.

The shaft 244 is driven by a large spur gear 250 meshing with a smaller spur gear 248 secured to the shaft 244. The gear 248 is driven by the stepping motor 251 through the gear 253 which is on shaft 252 and other gears, which are not shown, for the sake of clarity in the drawings.

Separating Mechanism

The separating mechanism 176 includes a common shaft 228 which spans all four channels of the dispenser. Four helical separator members 226 extend outwardly from the shaft 228. There is a separate helical separator member mounted on the shaft 228 for each of the four channels. These separators are not shown in detail in FIG. 14 for the reason that each segment is substantially the same as that shown in FIG. 5 of the drawings, except that there are four of the segments along the length of the common shaft 228.

The shaft 228 is rotated, upon command from the control circuitry (see FIG. 18) by a separator drive motor with a cam wheel and switch (as in FIGS. 2 and 4) to rotate the shaft one revolution. This rotates all of the helical separator members simultaneously, and any ticket which is in position for separation will be separated by this operation. The output drive rollers 246 then remove the ticket from the separator mechanism.

The strip 164 is shown in FIG. 14 extending all the way to the separator mechanism 168 at the top of the drawing.

In actual operation, the strip 164 will move forwardly to a position in which its leading edge is detected by an edge detector 275 near the input drive rolls 178, at which the ticket will stop, waiting for instructions to issue a new ticket. The position detected by detector 275 is upstream of the separation location 273, and the system controller shown in FIG. 18 will use the pre-stored ticket length to move the ticket forwardly or backwardly to bring the next perforation to the separation location 273.

A second edge detector 272 is located downstream from the separator location. Pulses from the stepping motor 251 which drives the ticket strips are counted by counting circuitry in the control circuit of FIG. 18. If the detector 272 does not detect a leading or trailing edge when it is supposed to be passing by, then the detector signals an error and stops the dispensing process until the error can be corrected.

As another alternative, the bar code reader 168 can do double-duty as a ticket location detector, if the bar code is located consistently from one game ticket to another.

When an instruction comes from the controller to dispense a ticket, the appropriate drive roller 232 is driven to move the edge of the strip over the separator structure 228 and towards the nip of the rollers 256 and 246. The edge of the ticket then enters the nip of those rollers and continues moving until the ticket has moved a predetermined distance, as determined by the controller using the pre-stored ticket length. If a single ticket is to be issued, the ticket stops, and the shaft 228 rotates, the separator mechanism separates the ticket in the manner described above. If a string of tickets is to be issued, the stepping motor pulses are counted until the desired number of tickets has passed, and then the perforation at the end of the string is stopped at the separation location, the string is separated, and then is issued from the machine.

Assuming that the code reader is located at the top of the mechanism, as shown in solid outlines in FIG. 14, the separated ticket then moves a distance further, while the rest of the strip is stationary, until the bar code, which is at a distance D from the leading edge of the ticket, reaches the bar code reader location. The ticket stops briefly, the bar code is read, and the ticket resumes movement. When it reaches the nip of a driven roller 264 and an idler 266, it is thrust against a curved guide 268 and bent, as shown at 270 and is caused to exit the machine through the outlet opening 188 in the front wall 186 of the machine.

The ticket passing through the separator mechanism 176 is guided in its curved path by a ramp 243, the curved inner surface 229 of the member 223 and the curved opening 227 in the brackets 29, 292, so as to achieve a certain degree of curvature and stiffness, at the time of separation, as in the FIGS. 2–6 embodiment.

Bar Code Reader

The bar code readers 168 can be of a variety of different types.

Preferred for its simplicity, small size, moderate cost and lack of moving parts, is a series of linear CCD scanners 263 (FIG. 15B) such as those used in facsimile machines. One of the linear arrays spans each of the four dispensing channels. However, if those scanners do not have sufficient resolution to read the bar codes reliably in issuing lottery tickets, the type of scanner shown in FIGS. 14 and 15 can be used.

In such a system, a movable scanner 168 (FIG. 15A) is used to read the codes on tickets in four bins or channels. The scanner contains an infrared LED emitter 262 and a photo-transistor receiver 260 (FIG. 14), thus constituting a standard wand-type bar code reader. Referring to FIG. 15A, the scanner 168 is mounted on a ball-screw drive rod 258, as shown in FIG. 15A, with a drive gear 259 secured to the shaft 258 which is driven by a motor 261. As it is well known in the art, the ball-screw 258 has reversing threads so that when the scanning head moves to the end of its path, it automatically returns to its start as the shaft continues to rotate. A limit switch 269 detects its return and stops the motor. Thus, the scanner 168 moves across the paths of the four channels, once forward and once back for each code reading operation. The scanner comes to rest at a position in the center of the four channels.

As an alternative, the code reader 168 or 263 can be an optical character recognition reader, and the code can be in any of the known OCR alphanumeric fonts, or in other OCR-readable fonts.

Figure 12:
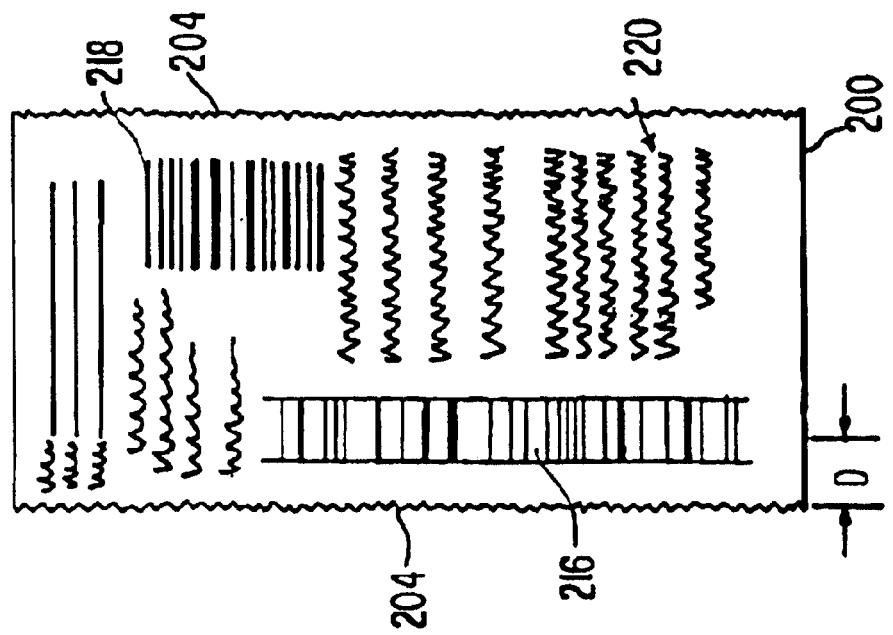
FIG. 12 is a bottom plan view of the underside of an instant-winner gaming ticket dispensed in accordance with the present invention.

If the bar code lines extend in a direction perpendicular to those shown in FIG. 12 so that the bars of the code extend perpendicular to the direction of movement of the ticket, the bar code reader 168 can be stationary and the motion of the tickets while being dispensed will provide the motion necessary to read the bar code.

Ticket Structure

Figure 13:
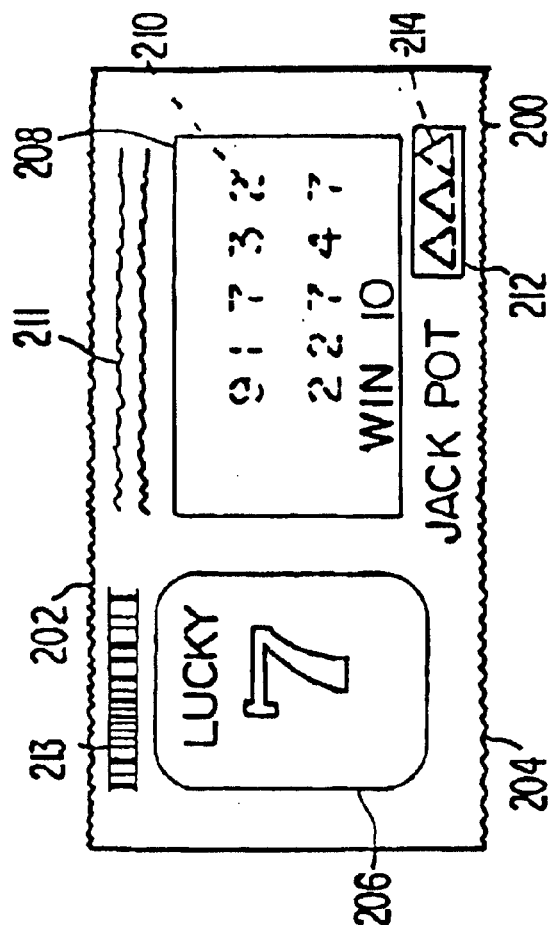
FIG. 13 is a top plan view of the gaming ticket shown in FIG. 12.

FIGS. 12 and 13 show the back and front, respectively, of a typical instant-winner lottery ticket 200, with certain modifications made in accordance with the present invention.

The ticket 200 has a leading edge 202 and a trailing edge 204. Typically, these edges are rough since they are formed by tearing the ticket strip apart along perforation lines.

Referring to FIG. 12, the rear of the ticket includes printed instructions 220 in human-readable printing, as well as bar code arrays 216 and 218. Only the array 216 contains information of interest in this invention. The strip of bar code marks extends across the width of the ticket and the center of the strip is located at a distance D from the leading edge 202 of the ticket.

Referring now to FIG. 13, the ticket has indicia 206 printed on it indicating the identity of the game in which the ticket is issued. In this case, the game is called "Lucky 7". Printed instructions are provided at 211 informing the purchaser how to play the game.

The ticket 200 shown in FIG. 13 is a so-called "scratch-off" type in which the game numbers shown in dashed outline at 210 are printed in an area 208 and then covered with an opaque coating which prevents the numbers from being seen until they are scratched off with a fingernail, or a coin, or a key, etc., as is well known. In the game in question, the purchaser wins $10 if three sevens appear among the numbers uncovered by scratching off the coating.

In accordance with an alternative feature of the present invention, a separate scratch-off area 212 can be provided with hidden indicia 214 indicating whether the ticket is a winner of a special jackpot prize. In this case, the appearance of three triangles indicates that the ticket is a jackpot winner, in a game to be described below.

Initializing the Controller

The bar code readers are used advantageously in initializing the controller of the vending or dispensing machine when a new supply of tickets is loaded into the machine.

The loading is accomplished by first feeding the lead end of the tickets upwardly into the drive mechanism with the drive motor "on". When the code on the ticket reaches the code reader 168, the bar code reader sends a signal to the microprocessor 122 of the controller (see FIG. 18) to stop the feeding of the ticket until the bar code has been read.

In some lottery tickets, the bar code of interest is located on the front side of the ticket, as indicated at 213 in FIG. 13. In this case, the bar code reader will be located on the front side of the tickets, as shown at 189 in FIG. 14.

The bar code typically contains certain standard information. First, there is a unique identifying code identifying the ticket. Secondly, the length of the ticket is recorded. Third, the number of tickets in the batch being loaded is recorded, as well as the game in which the ticket is issued, and the price of the ticket. Other information also is or can be supplied.

The code reader reads the information from the back of the first ticket, and sends it to the microprocessor 122 which then loads the ticket length into memory, together with the other information. Then, if the position of the code reader is at the upper end of the mechanism shown in FIG. 14, the ticket strip is reversed until the leading edge is detected by the edge detector 272 and the strip is ready for a dispensing operation.

If the code reader is at the lower position shown in FIG. 14, the ticket strip is moved forwardly to allow reading of the code in the first ticket and then reversed and the leading ticket is positioned for dispensing.

By this means, the information is automatically loaded into the controller and stored in memory without the service representative having to key it in on a keypad. This saves times and reduces the chances for error in inputting the information.

When bar codes are read from tickets during dispensing operations, if the reader is at the uppermost position shown in FIG. 14, then the identification of the ticket is not read from the back of the ticket until a dispensing operation is underway. If the ticket length is greater than the distance from the separator location 273 to the scanning location, the ticket stops very briefly while the bar code scanner scans the bar code, and then resumes its movement until it stops for separation of the ticket. If the ticket length is less, then the code is read after separation.

If the scanner position is the lower one in FIG. 14, then the bar code on the ticket is read prior to the ticket reaching the separation location. In this case, the information read is stored in a temporary storage location in the memory of the controlling system and held until the next dispensing operation, at which time it is retrieved and used. This is done so as to associate the proper code with the ticket.

Control System

Figure 18:
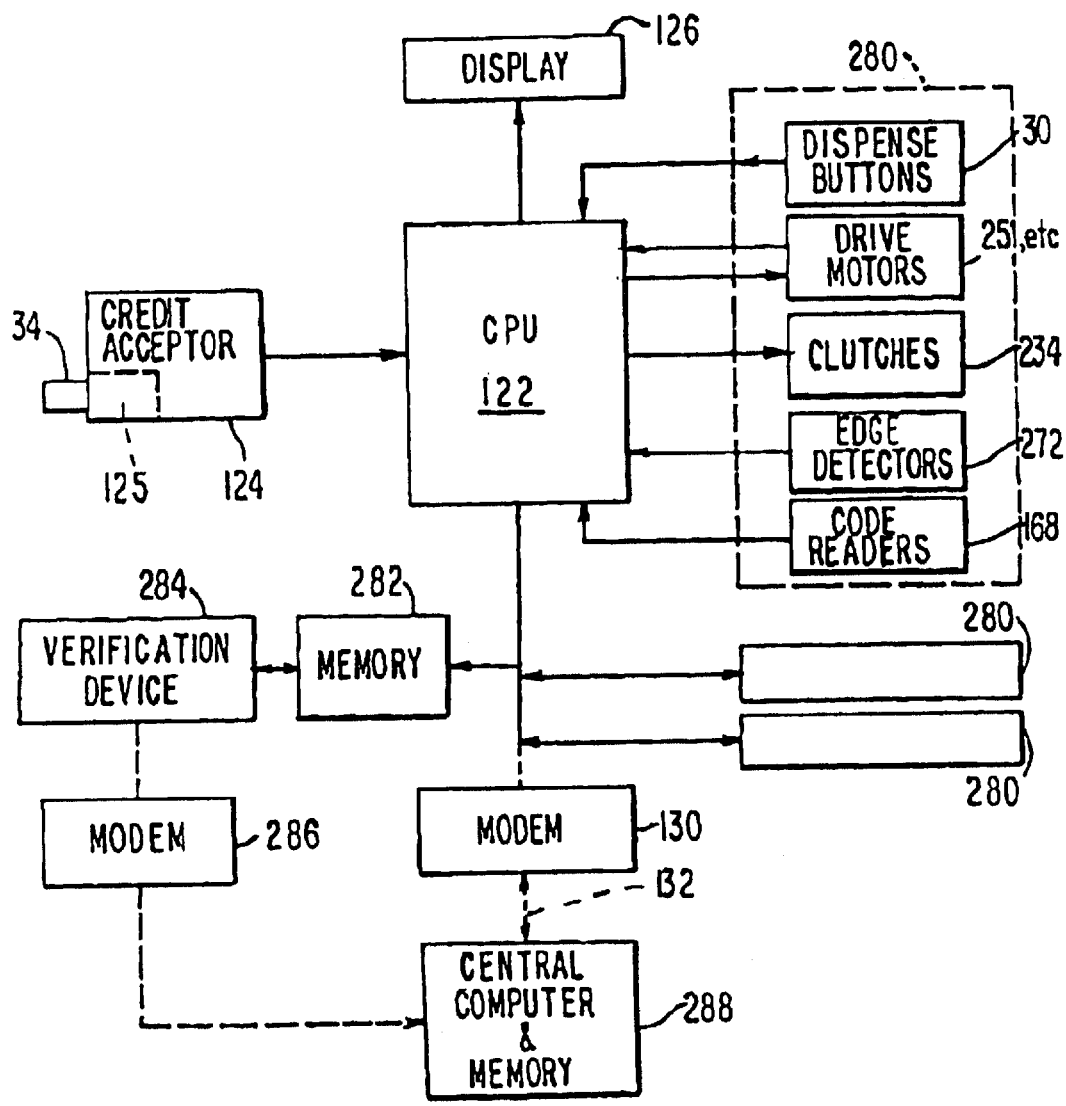
FIG. 18 is a schematic circuit diagram illustrating the electrical control system of the dispensing machine and system of the present invention.

FIG. 18 shows the control system for the vending machine in block diagram form. This control system is the same as that shown in FIG. 7 except for certain changes. Reference numerals from FIG. 7 are used to identify the same elements. Each group of four channels of the dispenser includes an identical set of controls 280. There is one of the groups 280 for every four channels of the dispensing machine. Of course, the number of channels included in each group can vary as desired.

Each group of controls includes a dispense button 30, drive motors 251, 261, etc., electric clutches 234, and edge detectors 272, one for each channel.

Ticket Verification

FIG. 18 also shows the operation of the invention in the verification of a winning ticket. A known verification device, such as those used at checkout counters in grocery stores, is connected to the memory 282 of the control system shown in FIG. 18, or, alternatively, to the system's central computer and memory 288 through a modem 286.

The information read from the back of each ticket preferably is stored both in local memory 282 and in the memory of the central computer through the modem 130 over standard telephone lines 132 or other communication links. Thus, the verification device can receive information either from the local memory 282 or from the central computer and memory 288, or both, as desired. It may be desirable to interrogate both memories, for example, in a system in which the local memory 286 is used to store recent information and that information is down-loaded periodically to the central computer memory.

Improved Accounting

In accordance with another feature of the invention, the data provided by the reading of information from every ticket dispensed gives added opportunity for improved accounting, in that the issuance of every ticket, not just winning tickets which have been cashed, can be recorded. This gives instantaneous information regarding what should be the remaining supply of tickets in each of the vending machines, and in general permits accounting for every ticket sold and the price at which it is sold. This, as well as the use of the invention initialization, reduces the chances for error and fraud.

Jackpot Game

In accordance with another feature of the invention, the ability to read bar codes off of each ticket is used to create a jackpot which can be won by customers of any of a number of different games in a lottery system, without providing a large jackpot in every game. This is done by designating one, two or three, or any similarly small number of tickets in a lottery system, to be designated as jackpot winners. The winners can be selected from different games.

Such Jackpot tickets can be marked with a scratch-off covering as shown at 212 in FIG. 13, if desired. In any event, the winning ticket identification number preferably is stored in every vending machine in the system, and/or in the central computer of the system, so that when it is detected that one of the winning tickets has been dispensed, the computer system will make the necessary adjustments in the jackpot amounts. The winner discovers that he or she has won the jackpot by an indication in a scratch-off area 212 on the ticket itself. The winner is detected by comparing the unique identification codes of each ticket dispensed with the pre-stored winning number in the computer. The amount of the jackpot can be displayed on the display 126, and it is stored in memory and can be retrieved when the winning ticket is verified.

The jackpot amount preferably is much larger than the maximum amount that can be won in the game in which the ticket is issued. This adds interest and excitement which attracts customers to each of the vending machines in the system.

In accordance with another feature of the invention, there are several ways in which the amount of the winning pool can be determined. It can be a fixed, pre-determined amount for each and every pool.

Alternatively, the pool can be accumulated over a period of time by setting aside a certain small percentage of the value of each ticket which is dispensed. This is possible because each and every ticket dispensed in the system is detected. Then, when the winning ticket has been issued, the computer automatically freezes the jackpot amount and starts a new jackpot.

Preferably, the new jackpot consists of a "shadow" jackpot which has been accumulated simultaneously with the main jackpot by accumulating and storing a smaller percentage of the price of each ticket sold simultaneously with the accumulation of money for the main jackpot. Then, when the main jackpot is won, the amount in the "shadow" jackpot becomes the amount in the main jackpot, and a new "shadow" jackpot is started.

Over-The-Counter Dispensing

The dispensing mechanism shown in FIG. 9 is especially advantageous in that it can be used in dispensing tickets upon demand by a clerk in a store selling tickets over-the-counter, as well as in stand-alone vending machines of the type shown in FIG. 1.

In existing over-the-counter ("OTC") dispensers, the lottery ticket strips are simply coiled, pulled out by hand, torn off by hand, and given to the purchaser. Typically, the tickets are pulled upwardly. Part of the dispenser is transparent so that the tickets can be seen. There is no detection of dispensed tickets.

The mechanism of FIG. 9 is advantageous in that it gives excellent tracking of the sale of the tickets, as described above, that presently does not exist in OTC sales. Also, the tickets are dispensed upwardly, as in existing dispensers. The other advantages of the mechanism and methods described above will be available in OTC sales, for the first time, at moderate cost.

The preferred over-the-counter or counter-top dispensers are shown in FIGS. 19 through 26, together with FIG. 18A.

Figure 19:
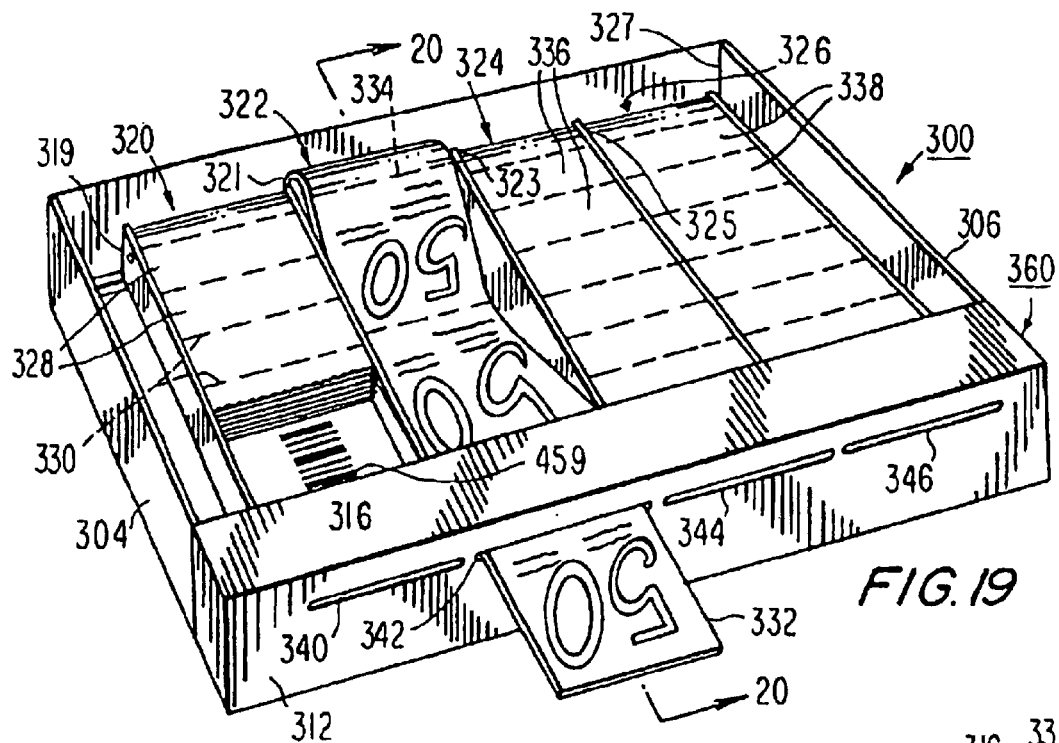
FIG. 19 is a front perspective view of a counter-top or wall-mounted compact dispensing unit constructed in accordance with the present invention.

FIG. 19 is a front perspective view of a counter-top dispenser 300 having instant-winner lottery tickets in each of four separate storage and dispensing channels 320, 322, 324 and 326.

Figure 20:
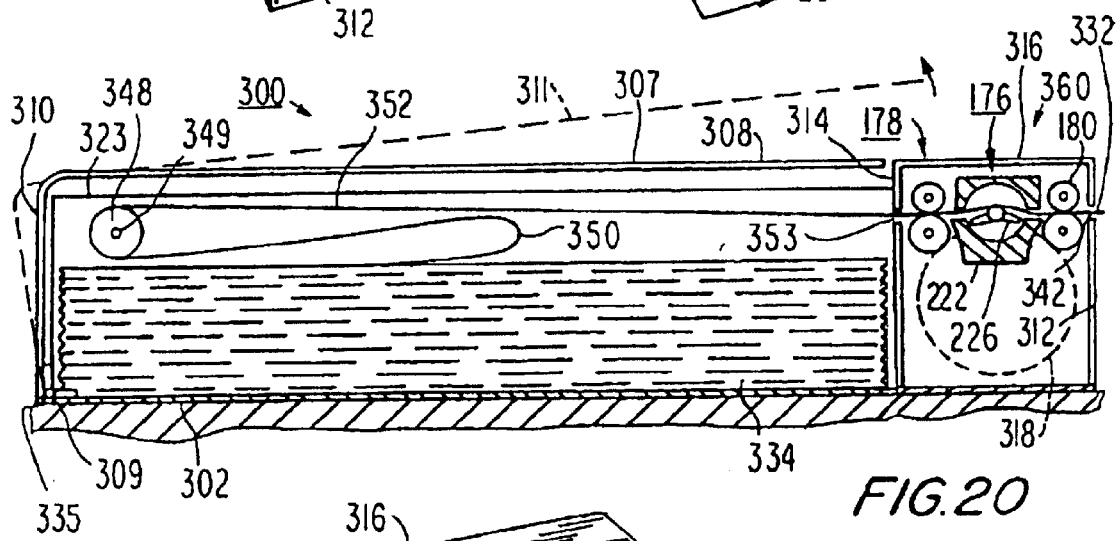
FIG. 20 is a cross-sectional and partially schematic view taken along line 20—20 of FIG. 19.

FIG. 20 is a cross-sectional and schematic view of the unit 300 of FIG. 19, taken along line 20—20.

Referring now to FIG. 20 as well as to FIG. 19, the unit 300 includes a bottom plate 302, vertical side walls 304 and 306 extending upwardly from the plate 302 (see FIG. 19) and a transparent cover 308 including a top wall 307 and a rear wall 310 hinged at the lower left hand edge by a hinge 309 to the bottom plate 302.

A drive and separator module 360 is provided at the right side of the housing in FIG. 20 (at the front in FIG. 19).

The module 360 has a front wall 312, a top wall 316 and an inner wall 314. The drive and separator mechanism in the module 360 is the same as that shown in FIG. 14, and the same reference numerals are used to depict the same parts in both figures.

A pair of drive rollers moves a ticket strip through an inlet opening 353 and towards the separator unit 176. A pair of outlet drive rollers 180 issues the ticket 332 through an outlet opening 342.

Referring again to FIG. 19, there are four ticket outlet openings 340, 342, 344 and 346, one for each of the four channels of the unit.

Still referring to FIG. 19, each of the four channels is defined by relatively thin vertical dividers 319, 321, 323, 325 and 327. Mounted between adjacent vertical dividers in each channel is a guide roller 348. A stack of fan-folded lottery tickets 334 is shown in the channel 322 in FIG. 20. The top layer 350 of the ticket strip is pulled around the roller 348 and the leading portion 352 is inserted into the ticket drive and separator unit 360.

The circle 318 shown in dashed lines inside the separator and drive housing 360 is a schematic representation of the two motors used to drive the mechanism shown in FIG. 14; that is, the drive motor 251 and the separator motor 80 (FIG. 2). These components are not shown in detail to avoid congestion in the drawings.

Figure 26:
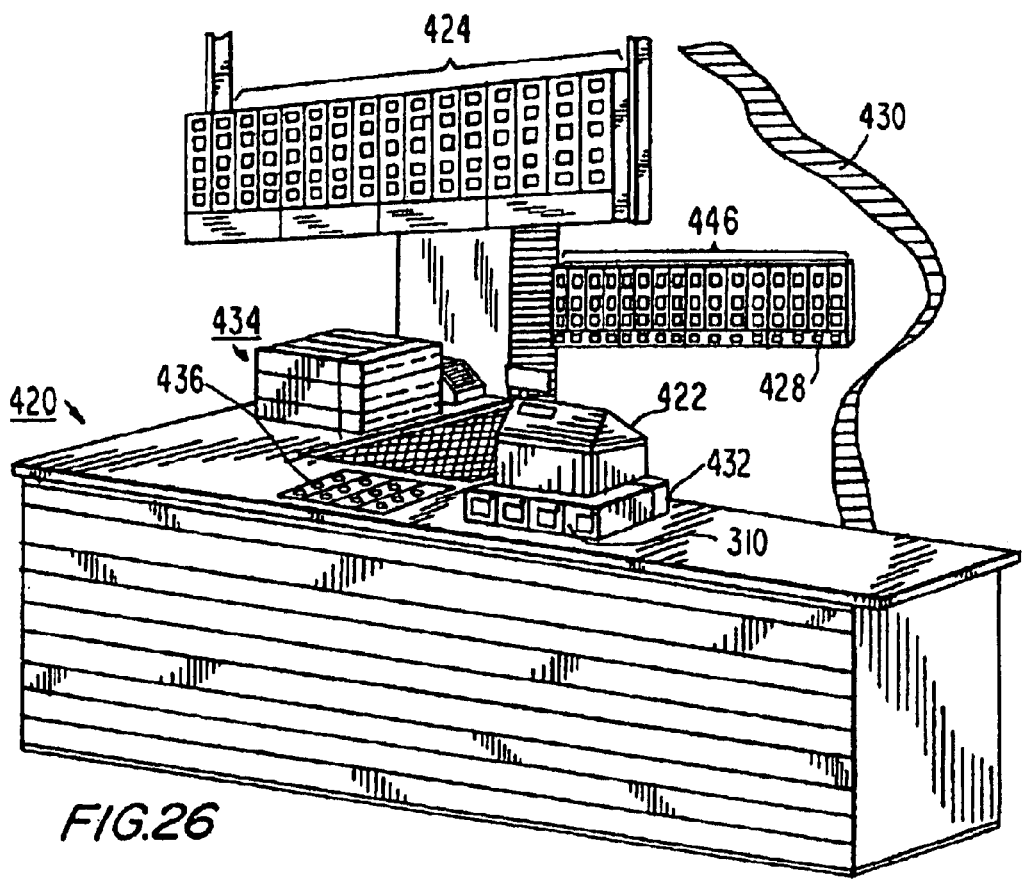
FIG. 26 is a front perspective view of a checkout counter in another store, also using the dispensers of the present invention.

In operation, the dispensing unit 300 is connected to a control unit, such as a computer terminal 422 shown in FIG. 26, such as one which is used to sell Lotto tickets in a store.

As an alternative to the circuit diagram shown in FIG. 18, the terminal 422 (see FIG. 26) having a microprocessor (not shown), a keyboard (not shown), and a display (not shown) may be included. When the store clerk inputs, via the keyboard, information identifying the game or games selected by the customer and the number of tickets, he or she enters the information and the microprocessor selects the proper one of several dispensers 300 to which it is connected, and the proper channel in that dispenser, and sends signals to the drive motors, clutches, and the edge detectors 275 and 272 of the unit selected to cause the appropriate number of tickets to be dispensed and separated.

As such, it can be seen that the credit acceptor 124 and the dispense buttons 30 (FIG. 18) are not needed. However, if preferred, dispense buttons also can be placed adjacent to every channel of the dispensing unit.

A signal accounting for the sale of the tickets again is sent through a modem 130 to a central computer 132, as with the embodiment shown in FIG. 18, or is recorded locally at the control unit. After information has been accumulated in memory in the local control unit, the information can be transferred to the central computer periodically by means of a dial-up modem.

If desired, the verification device 284, additional memory 282, and additional other features used in the FIG. 18 embodiment also can be used in the above-described alternative embodiment. However, it usually is preferred to keep the system as simple as possible so as to minimize cost.

In accordance with another feature of the invention, a bar code reader reading wand (not shown) is provided in each of the units 300. A bar code 459 (FIG. 19) is applied to the bottom of each channel or elsewhere in the dispensing unit adjacent each of the four channels. Each of the four bar codes is unique.

When a new supply of tickets is loaded into a particular channel, the bar code reading wand is used to read the bar code 459 on the channel, and on the reverse side of both the leading and the trailing ticket in the ticket string. This information in input into the computer so as to initialize the dispensing unit without the use of a separate keypad or the keyboard 452 for this purpose. This assists in minimizing input errors.

In another version of the invention, this same information can be input by way of the keyboard 452 instead of with the use of the bar code reading wand 458.

Referring again to FIGS. 19 and 20, when the drive motor 318 receives a signal to dispense tickets from channel 322, the drive roller for that channel is driven by the motor to pull the ticket strip towards the right in FIG. 20. The strip passes over the idler roller 348 and, when the bin is full or nearly full, the upper course 352 of the strip os close to the transparent cover 308 so that it can be seen easily as it moves.

When the ticket stack 334 is low, the upper course 352 of the strip slumps as shown in FIG. 19 (the bin 322 is shown substantially full in FIG. 20 for the purpose of illustration).

When the first perforation of the ticket strip reaches the separation location, then the separator motor is energized, rotating the helical separator blade 226 and separating the first ticket from the strip. The clerk then can take the ticket and hand it to the customer.

If a series of tickets of the same type are desired without separation, then the strip will be driven until the correct number of tickets has been issued, and then the entire string will be separated.

If it is desired to prevent slumping of ticket strips, as shown in FIG. 19, additional guide rollers can be provided along the top course 352 to hold it up at all times.

As it is, the fold at 350 in the ticket strip tends to hold the top course 352 up when the bin is full or nearly full.

Slumping is not a critical problem, because the transparency of the cover 308 allows the tickets to be seen by the customer and the clerk clearly anyway.

When it is desired to load a fresh supply of tickets into the dispenser, the hinged cover 308 is lifted in the direction indicated by the dashed line 311 and the arrow at the right end of that line to allow a new supply to be inserted into the housing.

Figure 21:
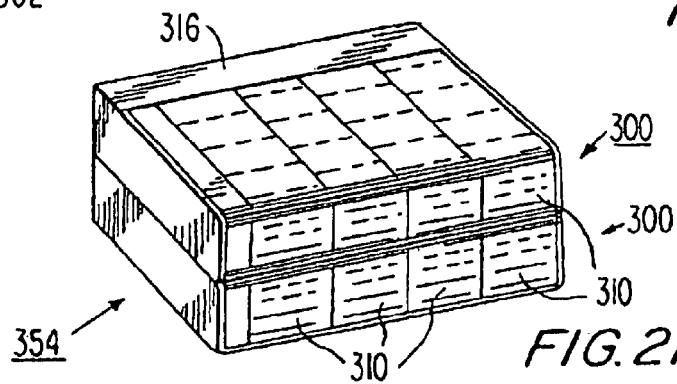
FIG. 21 is a rear perspective view of a pair of the units shown in FIG. 19 stacked atop one another.

The rear wall 310 of the cover also is transparent, a feature which allows the customer to see the tickets clearly from the rear side of the dispenser 300, even when the units 300 are stacked one on top of the other as shown in FIG. 21. Optionally, the bottom wall or plate 302 can be transparent too so as to increase visibility of the tickets when the dispenser is positioned as shown in FIG. 22 on the surface 372, provided the wall 370 is not present.

Thus, the customer is treated to the excitement of watching the tickets move past either the transparent end or the top of the transparent cover 308.

FIGS. 22 through 24 show additional embodiments of the counter-top dispensers of the present invention, with modifications to allow special mountings and display arrangements for the dispensers.

The dispenser 300 shown in FIGS. 19 and 20 is shown in FIG. 20 resting upon a horizontal surface 335, such as a counter-top or shelf in a store. However, the unit also can be mounted vertically.

The embodiment shown in FIG. 22 is advantageous in that the drive and separation unit 360 is mounted onto the top wall of the housing so that the unit can be mounted either vertically to a wall 370, or it can rest horizontally on the surface 372, using both the end of the ticket housing and the housing of the unit 360 to support the unit in a vertical orientation.

The hinged cover is shown at 362. It is shortened as compared with the cover 308 of FIG. 20. Support members 366 and 364 are provided across the top of the unit to which the unit 360 is secured.

The lower portion of the ticket strip bends and enters the drive unit 360 as the ticket 332 exits in a direction perpendicular to the cover 362.

An additional guide roller 368 is shown in dashed outline as an option to help hold the stack of tickets in a vertical orientation.

FIG. 23 shows a unit similar to that of FIG. 22 except that the drive and separation unit 360 is located near the top of the housing instead of at the bottom. Support elements 380 and 378 are used to secure the unit 360 to the housing.

The transparent cover 374 is hinged at the bottom by a hinge 376 so as to provide access to the housing for replenishing the ticket supply. The unit shown in FIG. 23 is particularly well adapted to be mounted vertically on a wall, as shown at 370.

FIG. 24 shows a unit like those shown in FIGS. 22 and 23, except that the drive and separation unit 360 is mounted in the center of the housing instead of at either end. It is supported by support members 382 and 384. The transparent cover is hinged at 309 to provide access to the interior of the unit.

The unit shown in FIG. 24 rests on a horizontal surface 335, and the ticket is issued straight upwardly.

Each of the embodiments shown in FIGS. 22, 23 and 24 can be used to advantage in a variety of different locations and under a variety of different mounting requirements.

The side walls 304, 306 and the housing 316 for the separator/drive mechanism preferably are made of steel, and the remaining walls 308, 310 are made of a shatter-resistant, strong material such as "Lexan" brand transparent plastic.

The base plate 302 is either steel or Lexan, as desired. A lock (not shown) is provided for each unit. Thus, each unit is a strong, secure holder for the valuable tickets stored within.

Figure 25:
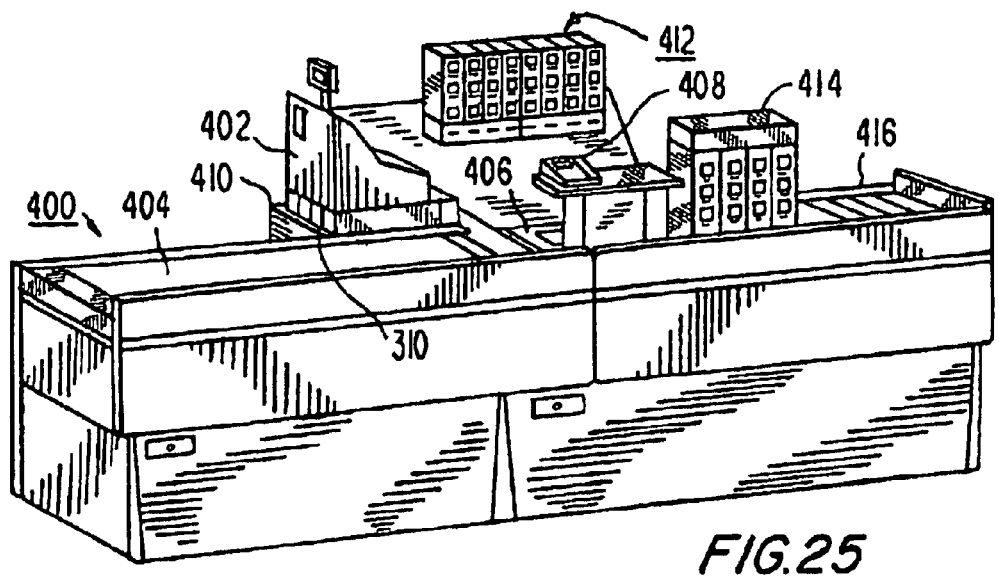
FIG. 25 is a front perspective view of a grocery store checkout counter utilizing dispensers constructed in accordance with the present invention.

FIG. 25 shows the installation and use of the dispensers here under consideration at a typical supermarket check-out counter 400.

The counter includes a conveyor belt 404 for moving the purchases towards the clerk's station behind a cash register 402. A conventional scanner 406 is provided to scan the bar codes from the products for entry into the computerized point-of-sale system and registry in the cash register 402.

A credit/debit-card "swiper" 408 is provided which the customer can use to validate his or her credit/debit card.

Dispensers constructed in accordance with the present invention are shown in use at four different locations. One unit 410 is located underneath the cash register 402, its transparent rear wall 310 is visible so that the customer can see the tickets which are available for purchase.

A second location s indicated at 412, where two of the dispenser units are shown mounted on a shelf. Preferably, such units are of the type which issues the tickets in a direction perpendicular to the front wall of the housing.

A third location is shown at 415, where a dispenser unit stands vertically on the counter. The tickets can be issued vertically upwardly, or perpendicular to the front of the dispenser unit, either towards the clerk or the customer.

Finally, a dispenser unit is located underneath the counter at 416 where it is covered by a transparent section of the counter-top so that the customer can see the selection of tickets available.

The electronic control of the dispensers can be exercised from a separate computer terminal (not shown in FIG. 25) such as that used to sell Lotto tickets, as described above.

Alternatively, a separate small terminal can be provided for the purpose.

FIG. 26 shows a typical counter 420 in a store other than a grocery store.

On top of the counter 420 is a computer terminal 422, such as that used to sell lottery tickets, and/or another terminal used in registering sales data and transactions.

Ticket dispensers are shown mounted in four different locations. A first location is at 432, underneath the terminal 422.

A second location is at 434, where three of the dispenser units are stacked atop one another. The transparent ends of the units face outwardly towards the customer, and the fronts of the units face towards the clerk.

A third location is at 436 underneath a transparent window in the counter-top.

A fourth location is at 424 on a ceiling-mounted rack.

Finally, a wall-mounted array 426 of machines also is provided.

If desired, one of the four dispensing units 428 contains a bill acceptor and electronic controls as in FIGS. 1, 7 and 18, which are used to select tickets from each of the wall-mounted dispensers. Push buttons as in FIG. 1, etc. can be provided, if desired, on the units themselves so as to provide an easy means of selecting the type and number of tickets to be dispensed, if it is not desired to connect the dispensers to a computer terminal. If desired, multiple dispensing units 428 can be mounted in a single housing, to form a stand-alone ticket vending machine.

The various shapes of dispensing units shown in FIGS. 22 through 24 can be used to provide various combinations of dispensing units laying flat or standing on their ends and stacked together to provide compact dispensing arrangements visible to the customer but which do not occupy much space.

It can be seen from the foregoing that the objectives of the invention have been well met by the equipment and methods described above.

The above description of the invention is intended to be illustrative and not limiting. Various changes or modifications in the embodiments described may occur to those skilled in the art. These can be made without departing from the spirit or scope of the invention.

What is claimed is:

1. A ticket dispenser for dispensing tickets from strips in which said tickets are delineated from one another by lines of weakness, said dispenser comprising:
    a housing having a bottom, a first and a second side wall spaced from one another and a cover extending between the side walls,
    a plurality of ticket storage areas in said housing,
    a plurality of ticket transport devices,
    a separator device adjacent said transport devices and receiving a strip of said tickets transported from one of said ticket storage areas to said separator device by one of said transport devices;
    said separator device including a dull elongated member spanning the paths taken by each of said strips received by said separator device, the dull elongated member for separating the tickets along one of the lines of weakness; and
    a drive device operatively coupled to said elongated member for actuating said elongated member to separate one ticket from another in at least one of said strips.

2. A dispenser as in claim 1 in which said cover comprises a top wall generally parallel to said bottom and a rear wall generally perpendicular to said bottom, wherein said cover is transparent and said top wall is positioned to overlie said ticket storage areas when said dispenser is positioned with said bottom resting on a horizontal surface so that said ticket strips are visible through said rear wall.

3. A dispenser as in claim 2 including a guide means in said housing for guiding said strips of tickets past said rear wall when said strips move during dispensing.

4. A dispenser as in claim 1 in which said housing is rectangular in cross-section, and said cover comprises a top wall generally parallel to said bottom and a rear wall generally perpendicular to said bottom, wherein the spacing between said top wall and said bottom is much smaller than the spacing between said side walls, and in which said ticket storage areas are elongated, side-by-side rectangular spaces for receiving one of the said ticket strips folded over upon itself.

5. A dispenser as in claim 1 in which said cover comprises a top wall generally parallel to said bottom and a rear wall generally perpendicular to said bottom, wherein at least said rear wall is transparent, said rear wall spanning said ticket storage areas so as to make said ticket strips in said ticket storage areas visible through said rear wall.

6. A dispenser as in claim 5, said housing further comprising a plurality of outlet openings, one for each of the ticket storage areas in said housing, and said outlet openings being opposite said rear wall.

7. A dispenser as in claim 6 in which said ticket transport devices and said separator device are located adjacent said outlet openings for moving tickets separated from said strips out of said housing through said outlet openings in a direction generally parallel to said top wall.

8. A dispenser as in claim 1 in which said cover is connected to said bottom by at least one hinge so that said cover can be moved to permit access into the interior of said housing.

9. A ticket dispenser for dispensing tickets from strips in which said tickets are delineated from one another by lines of weakness, said dispenser comprising:
- a housing having a bottom, a first and a second side wall spaced from one another and a cover extending between the side walls,
- a plurality of ticket storage areas in said housing,
- a plurality of ticket transport devices,
- a separator device receiving a strip of said tickets transported from one of said ticket storage areas to said separator device by one of said transport devices;
- said separator device including a dull elongated member spanning the paths taken by each of said strips received by said separator device, the dull elongated member for separating the tickets along one of the lines of weakness; and
- a drive device operatively coupled to said elongated member for actuating said elongated member to separate one ticket from another in at least one of said strips.

* * * * *